(12) United States Patent
Pirsiavash

(10) Patent No.: US 12,398,847 B2
(45) Date of Patent: *Aug. 26, 2025

(54) SYSTEM FOR PROVIDING INTEGRATED PIPELINE INTEGRITY DATA

(71) Applicant: FATHOM SOLUTIONS FOR COMMUNICATIONS AND INFORMATION TECHNOLOGY, Eastern Region (SA)

(72) Inventor: Mehdi Hassan Pirsiavash, Muscat (OM)

(73) Assignee: FATHOM SOLUTIONS FOR COMMUNICATIONS AND INFORMATION TECHNOLOGY, Eastern Region (SA)

(*) Notice: Subject to any disclaimer, the term of this patent is extended or adjusted under 35 U.S.C. 154(b) by 0 days.

This patent is subject to a terminal disclaimer.

(21) Appl. No.: 17/942,712

(22) Filed: Sep. 12, 2022

(65) Prior Publication Data

US 2024/0019086 A1 Jan. 18, 2024

Related U.S. Application Data

(63) Continuation-in-part of application No. PCT/IB2021/053901, filed on May 7, 2021.

(60) Provisional application No. 62/989,065, filed on Mar. 13, 2020.

(51) Int. Cl.
*F17D 5/00* (2006.01)
*G06F 30/18* (2020.01)

(52) U.S. Cl.
CPC .............. *F17D 5/00* (2013.01); *G06F 30/18* (2020.01)

(58) Field of Classification Search
CPC ...... F16L 55/26; F16L 2101/30; G01N 21/85; G01M 5/0033; G01M 3/2823; G06F 30/17

See application file for complete search history.

(56) References Cited

U.S. PATENT DOCUMENTS

| | | | |
|---|---|---|---|
| 2011/0295575 A1* | 12/2011 | Levine | G06F 17/10 703/2 |
| 2017/0350864 A1* | 12/2017 | Goroshevskiy | G01N 27/82 |
| 2020/0191316 A1* | 6/2020 | Du | G06Q 10/0635 |
| 2020/0379142 A1* | 12/2020 | Gerling | G01V 99/00 |
| 2023/0176015 A1* | 6/2023 | Fadhel | G01N 33/2045 73/579 |
| 2023/0229833 A1* | 7/2023 | El-Chami | G06F 30/27 703/2 |

* cited by examiner

*Primary Examiner* — Mirza F Alam
(74) *Attorney, Agent, or Firm* — Sughrue Mion, PLLC

(57) ABSTRACT

A system for providing an interface that allows access to a system used to collect oil and gas pipeline integrity related data sets, inspection and survey reports to process the integrity status and to determine the remaining lifetime of each point of a pipeline on a sophisticated mapping platform. This system allows a user to access databases to access information needed for all pipeline integrity analysis. The system integrates the databases to allow easy access and centralized storage of all needed information for pipeline integrity assessment to deploy the results in an augmented reality platform. The system includes artificial intelligence to compare two or more consecutive In-Line Inspection reports to determine the internal and external corrosion rate in the oil and gas pipeline.

13 Claims, 22 Drawing Sheets

SYSTEM FOR PROVIDING INTEGRATED PIPELINE INTEGRITY DATA

CROSS-REFERENCE TO RELATED APPLICATIONS

This application is a continuation-in-part of, and claims priority from, PCT/IB2021/053901, filed on May 7, 2021, which claims priority from U.S. Provisional Application No. 62/989,065 filed on Mar. 13, 2020 in the U.S. Patent & Trademark Office, the disclosures of which are incorporated herein by reference in their entirety.

TECHNICAL FIELD

Aspects of one or more non-limiting embodiments of the disclosure generally relate to analyzing the integrity of oil and gas transmission pipes and to methods, apparatuses, and systems for providing an interface for comprehensively collecting a wide variety of pipeline integrity related data sets, and inspection and survey reports, to process the integrity status and to determine the remaining lifetime of each point of a pipeline on a sophisticated mapping platform.

BACKGROUND

Corrosion of metal is a long-standing historical and global problem in a wide range of industries, and the oil and gas industry is not an exception. Pipeline operators are faced with many questions about the presence, location, and severity of corrosion in their oil and natural gas pipeline systems. In particular, pipeline operators need easy and centralized access to comprehensive pipeline integrity information, from many different sources, to accurately assess the integrity of each point of a pipeline and deploy the results of such assessment efficiently and effectively.

SUMMARY

Illustrative, non-limiting embodiments of the present disclosure address the above disadvantages and other disadvantages not described above. Also, a non-limiting embodiment is not required to overcome the disadvantages described above, and an illustrative, non-limiting embodiment may not overcome any of the problems described above.

Aspects of one or more example embodiments allow a user to access databases to access information needed to comprehensive pipeline integrity analysis. In particular, aspects of one or more example embodiments integrate various databases to allow easy access and centralized storage of all needed information for pipeline integrity assessment to deploy the results, for example, in an Augmented Reality platform.

Aspects of one or more example embodiments may include artificial intelligence to compare two or more consecutive In-Line Inspection (ILI) reports to determine the internal and external corrosion rate in the oil and gas pipeline.

Additional embodiments will be set forth in the description that follows and, in part, will be apparent from the description, and/or may be learned by practice of the presented embodiments of the disclosure.

BRIEF DESCRIPTION OF THE DRAWINGS

Features, advantages, and significance of non-limiting embodiments of the disclosure will be described below with reference to the accompanying drawings, in which like signs denote like elements, and wherein:

FIG. 1A shows a process flow diagram of a Data Collection and Validation module according to a non-limiting embodiment;

FIG. 1B shows a process flow diagram of a Pipeline Integrity Management Systems (PIMS) module according to a non-limiting embodiment;

FIG. 1C shows a process flow diagram of a Risk Assessment module according to a non-limiting embodiment;

FIG. 1D shows a process flow diagram of an In-Line Inspection (ILI) Enterprise module according to a non-limiting embodiment;

FIG. 1E shows a process flow diagram of a Corrosion Growth Rate (CGR) & Corrosion Initial Rate (CIR) module according to a non-limiting embodiment;

FIG. 1F shows a process flow diagram of an Integrity Assessment & Fitness-for-Service (FFS) Calculation module according to a non-limiting embodiment;

FIG. 1G shows a process flow diagram of a Prevention, Mitigation, Monitoring & Action module according to a non-limiting embodiment;

FIG. 1H shows a process flow diagram of a Real Time Transient Model (RTTM) Based Integrity Assessment module according to a non-limiting embodiment;

FIG. 1I shows a process flow diagram of a Management Review, Integrity Performance & Key Performance Indicator (KPI) module according to a non-limiting embodiment;

FIG. 1J shows an overall process flow diagram incorporating the process flow diagrams shown in FIGS. 1A, 1B, 1C, 1D, 1E, 1F, 1G, 1H and 1I;

DETAILED DESCRIPTION

Figure 1A:
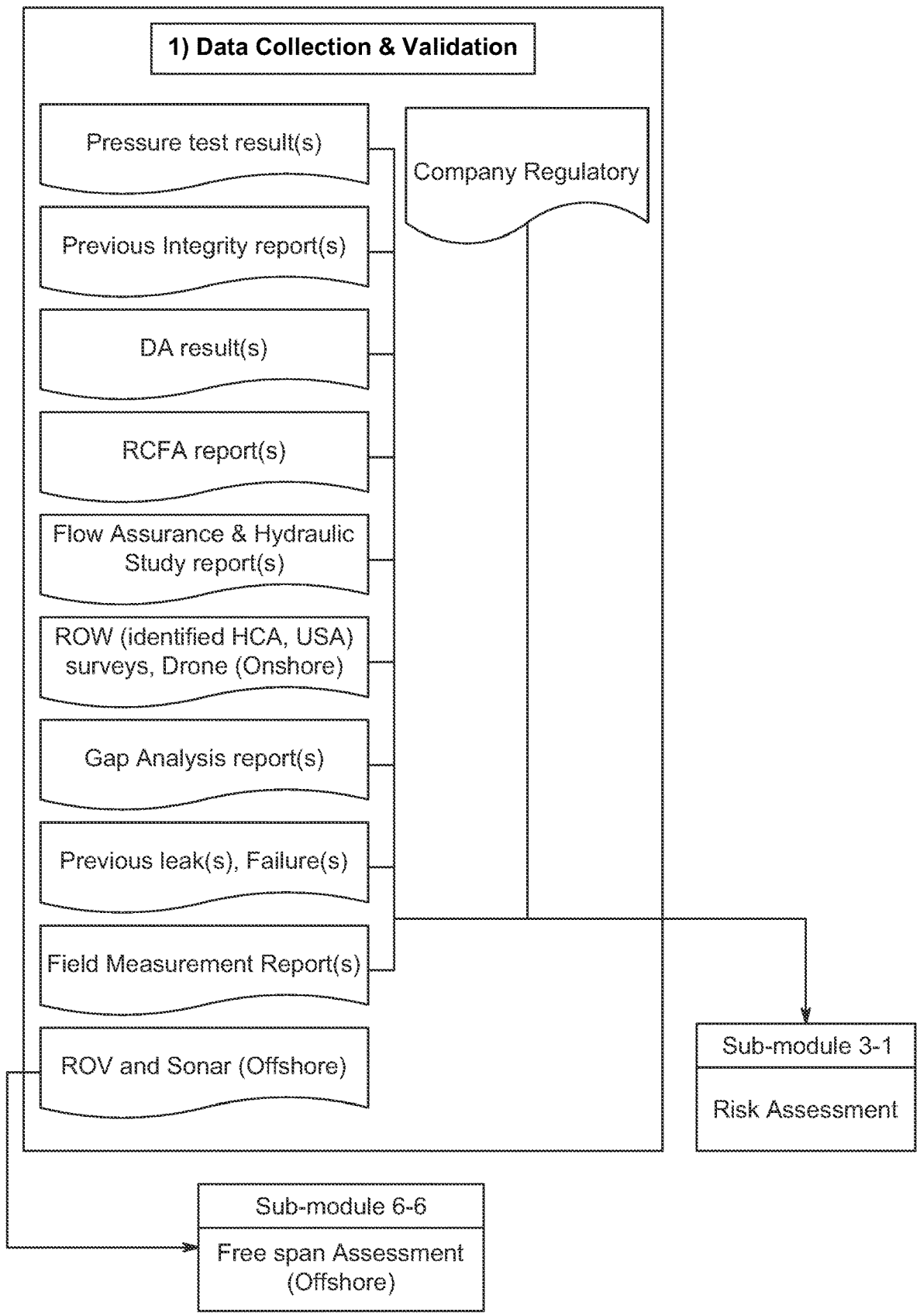
FIGS. 1A, 1B, 1C, 1D, 1E, 1F, 1G, 1H, 1I and 1J show process flow diagrams according to a non-limiting embodiment.

The following detailed description of example non-limiting embodiments refers to the accompanying drawings. The same reference numbers in different drawings may identify the same or similar elements.

The matters defined in the description, such as detailed construction and elements, are provided to assist in a comprehensive understanding of the example embodiments. However, it is apparent that the example non-limiting embodiments can be practiced without those specifically defined matters. Also, well-known functions or constructions are not described in detail since they would obscure the description with unnecessary detail.

The foregoing disclosure provides illustration and description, but is not intended to be exhaustive or to limit the implementations to the precise form disclosed. Modifications and variations are possible in light of the above disclosure or may be acquired from practice of the implementations. Further, one or more features or components of one embodiment may be incorporated into or combined with another embodiment (or one or more features of another embodiment). Additionally, in the flowcharts and descriptions of operations provided below, it is understood that one or more operations may be included or omitted, one or more operations may be added, one or more operations may be performed simultaneously (at least in part), and the order of one or more operations may be switched.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code. It is understood that software and hardware may be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Also, as used herein, the terms "has," "have," "having," "include," "including," or the like are intended to be open-ended terms. Further, the phrase "based on" is intended to mean "based, at least in part, on" unless explicitly stated otherwise. Furthermore, expressions such as "at least one of [A] and [B]" or "at least one of [A] or [B]" are to be understood as including only A, only B, or both A and B.

Also, in the present specification, it will be understood that when elements are "connected" or "coupled" to each other, the elements may be directly connected or coupled to each other, but may alternatively be connected or coupled to each other with an intervening element therebetween, unless specified otherwise.

FIGS. 1A, 1B, 1C, 1D, 1E, 1F, 1G, 1H, 1I and 1J show process flow diagrams according to a non-limiting embodiment. As shown in FIGS. 1A, 1B, 1C, 1D, 1E, 1F, 1G, 1H, 1I and 1J, a variety of pipeline integrity related data sets, inspections, surveys and reports are collected to analyze pipeline integrity and to determine the remaining lifetime of each point of a pipeline on a sophisticated mapping platform. A non-limiting embodiment consistent with FIGS. 1A, 1B, 1C, 1D, 1E, 1F, 1G, 1H, 1I and 1J allows a user to access various databases to access the comprehensive information needed for pipeline integrity analysis. As shown in FIGS. 1A, 1B, 1C, 1D, 1E, 1F, 1G, 1H, 1I and 1J, the various databases are integrated to allow easy access and centralized storage of all needed information for pipeline integrity assessment to deploy the results. According to a non-limiting embodiment, the results may be deployed in an Augmented Reality (AR) platform.

Figure 2:
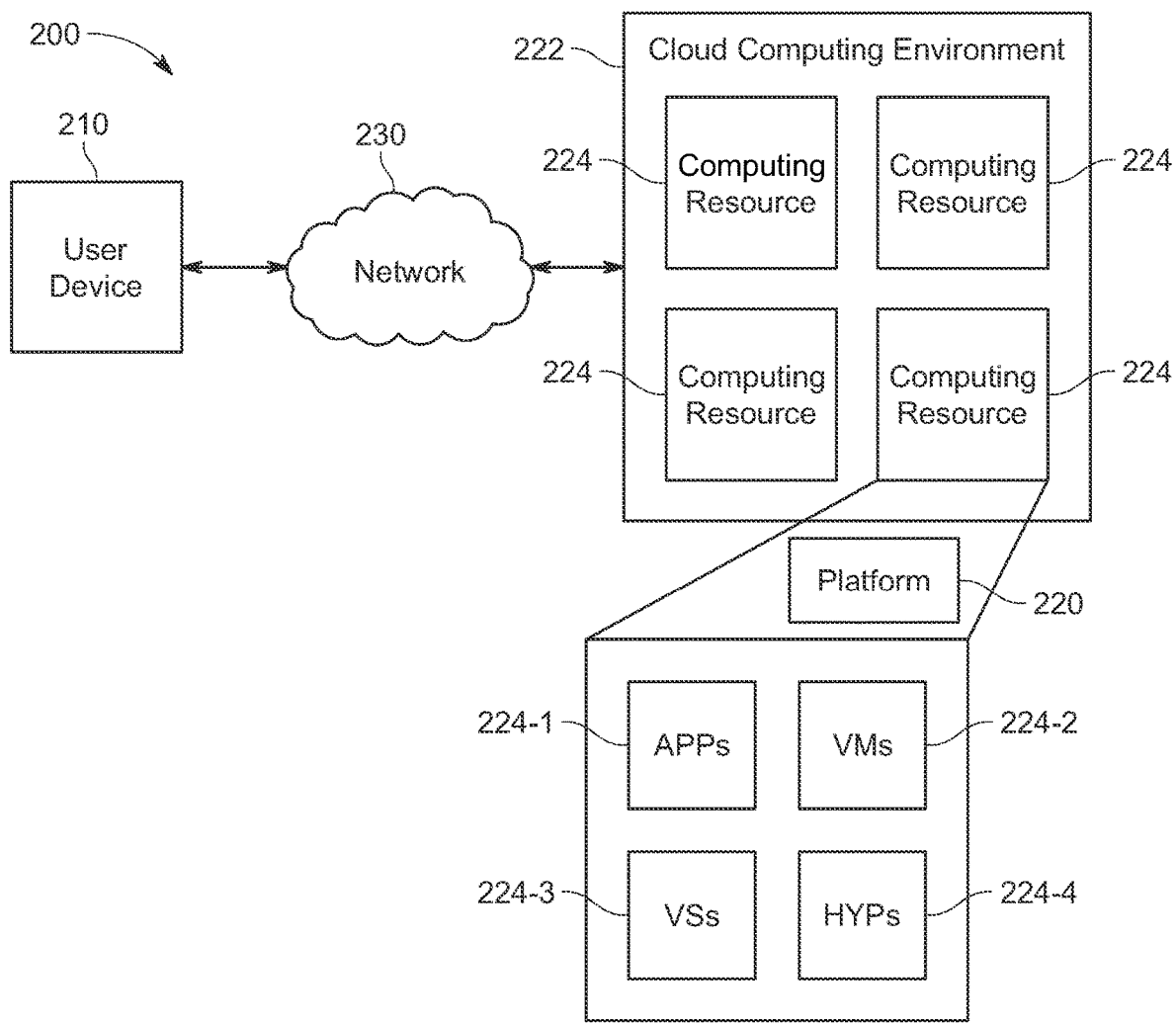
FIG. 2 is a diagram of an example environment in which systems and/or methods according to one or more embodiments may be implemented.

FIG. 2 is a diagram of an example environment in which systems and/or methods according to one or more embodiments may be implemented.

FIG. 2 is a diagram of an example environment 200 in which systems and/or methods, described herein, may be implemented. As shown in FIG. 2, environment 200 may include a user device 210, a platform 220, and a network 230. Devices of environment 200 may interconnect via wired connections, wireless connections, or a combination of wired and wireless connections. In embodiments, any of the functions and operations described herein may be performed by any combination of elements illustrated in FIG. 2.

User device 210 includes one or more devices capable of receiving, generating, storing, processing, and/or providing information associated with platform 220. For example, user device 210 may include a computing device (e.g., a desktop computer, a laptop computer, a tablet computer, a handheld computer, a smart speaker, a server, etc.), a mobile phone (e.g., a smart phone, a radiotelephone, etc.), a wearable device (e.g., a pair of smart glasses or a smart watch), or a similar device. In some implementations, user device 210 may receive information from and/or transmit information to platform 220.

Platform 220 includes one or more devices capable of receiving, generating, storing, processing, and/or providing information. In some implementations, platform 220 may include a cloud server or a group of cloud servers. In some implementations, platform 220 may be designed to be modular such that certain software components may be swapped in or out depending on a particular need. As such, platform 220 may be easily and/or quickly reconfigured for different uses.

In some implementations, as shown, platform 220 may be hosted in cloud computing environment 222. Notably, while implementations described herein describe platform 220 as being hosted in cloud computing environment 222, in some implementations, platform 220 may not be cloud-based (i.e., may be implemented outside of a cloud computing environment) or may be partially cloud-based.

Cloud computing environment 222 includes an environment that hosts platform 220. Cloud computing environment 222 may provide computation, software, data access, storage, etc. services that do not require end-user (e.g., user device 210) knowledge of a physical location and configuration of system(s) and/or device(s) that hosts platform 220. As shown, cloud computing environment 222 may include a group of computing resources 224 (referred to collectively as "computing resources 224" and individually as "computing resource 224").

Computing resource 224 includes one or more personal computers, a cluster of computing devices, workstation computers, server devices, or other types of computation and/or communication devices. In some implementations, computing resource 224 may host platform 220. The cloud resources may include compute instances executing in computing resource 224, storage devices provided in computing resource 224, data transfer devices provided by computing resource 224, etc. In some implementations, computing resource 224 may communicate with other computing resources 224 via wired connections, wireless connections, or a combination of wired and wireless connections.

As further shown in FIG. 2, computing resource 224 includes a group of cloud resources, such as one or more applications ("APPs") 224-1, one or more virtual machines ("VMs") 224-2, virtualized storage ("VSs") 224-3, one or more hypervisors ("HYPs") 224-4, or the like.

Application 224-1 includes one or more software applications that may be provided to or accessed by user device 210. Application 224-1 may eliminate a need to install and execute the software applications on user device 210. For example, application 224-1 may include software associated with platform 220 and/or any other software capable of being provided via cloud computing environment 222. In some implementations, one application 224-1 may send/receive information to/from one or more other applications 224-1, via virtual machine 224-2.

Virtual machine 224-2 includes a software implementation of a machine (e.g., a computer) that executes programs like a physical machine. Virtual machine 224-2 may be either a system virtual machine or a process virtual machine, depending upon use and degree of correspondence to any real machine by virtual machine 224-2. A system virtual machine may provide a complete system platform that supports execution of a complete operating system ("OS"). A process virtual machine may execute a single program, and may support a single process. In some implementations, virtual machine 224-2 may execute on behalf of a user (e.g., user device 210), and may manage infrastructure of cloud computing environment 222, such as data management, synchronization, or long-duration data transfers.

Virtualized storage 224-3 includes one or more storage systems and/or one or more devices that use virtualization techniques within the storage systems or devices of computing resource 224. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

Hypervisor 224-4 may provide hardware virtualization techniques that allow multiple operating systems (e.g., "guest operating systems") to execute concurrently on a host computer, such as computing resource 224. Hypervisor 224-4 may present a virtual operating platform to the guest operating systems, and may manage the execution of the guest operating systems. Multiple instances of a variety of operating systems may share virtualized hardware resources.

Network 230 includes one or more wired and/or wireless networks. For example, network 230 may include a cellular network (e.g., a fifth generation (5G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, or the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
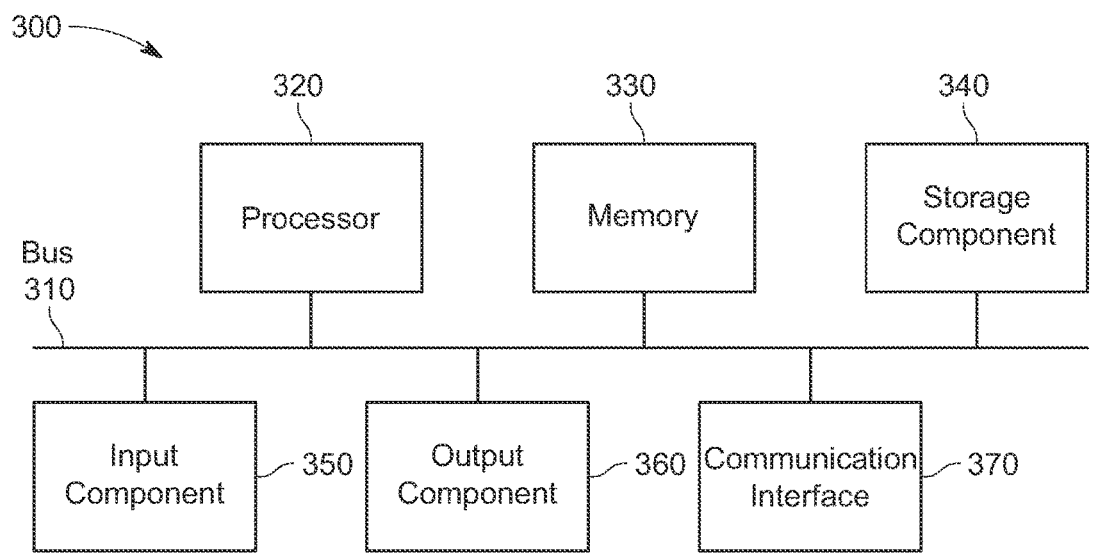
FIG. 3 is a diagram of example components of a device according to an embodiment.

FIG. 3 is a diagram of example components of a device 300, according to a non-limiting embodiment. Device 300 may correspond to user device 210 and/or platform 220. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 may be implemented in hardware, firmware, or a combination of hardware and software. Processor 320 may be a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein.

Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

In non-limiting embodiments, any one of the operations or processes described herein may be implemented by or using any one of the elements illustrated in FIGS. 2-3.

The aspects of the process flow diagram shown in FIGS. 1A, 1B, 1C, 1D, 1E, 1F, 1G, 1H, 1I and 1J are described in turn below. Although the modules are described in a specific order below, and although FIGS. 1A, 1B, 1C, 1D, 1E, 1F, 1G, 1H, 1I and 1J show specific relationships between the modules and sub-modules, according to various non-limiting embodiments, modules and sub-modules may be implemented having different relationships, modules and sub-modules may be implemented in different orders, modules and sub-modules may be implemented at the same time or at different times, some module(s) and sub-module(s) may be implemented while other module(s) and sub-module(s) may not be implemented, and module(s) and sub-module(s) may be included or omitted, as appropriate.

1) Data Collection & Validation

According to a non-limiting embodiment, as shown in FIG. 1A, a Data Collection and Validation module may be implemented to collect, input and validate various data, results, reports, surveys, analyses, and the like. Various non-limiting sub-modules of the Data Collection and Validation module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

As shown in FIG. 1A, according to a non-limiting embodiment, after any of the sub-modules entitled Pressure Test Result(s), Previous Integrity Report(s), Direct Assessment (DA) result(s), Root Causes Failure Analysis (RCFA) Report(s), Flow Assurance & Hydraulic Study Report(s), Right of Way (ROW), Identified High Consequences Area (HCA), Unusual Sensitive Area (USA) surveys, Drone (On-shore), Gap Analysis Report(s), Previous Leak(s), Failure (s), Field Measurement Report(s), Company Regulatory, the process flow may proceed to Sub-Module 3-1 Risk Assessment.

Pressure Test Result(s)

According to a non-limiting embodiment, various Pressure Test result data may be collected, input and validated in a Pressure Test Result's sub-module. Pipeline pressure testing is a means of assessing a pipeline's integrity. Pipeline pressure testing involves isolating a segment of pipeline and filling the pipeline with water, inert gas, air, or in some cases, natural gas, under pressure that is higher than the pipeline's normal operating pressure. The higher-pressure level is then maintained over several hours to see if the pipeline has or develops any leaks. If there are no leaks, then the pipeline can resume normal, safe operation. If the pipeline has or develops any leaks during the test, it is either repaired or replaced.

This technique has been the time proven method of testing pipelines prior to placing them into service and for retesting after a period of service. Pipeline pressure testing involves removing the pipeline from service, inserting water and pressurizing the water to a high-pressure level, usually 1.25 to 1.40 times the maximum operating pressure. The disadvantage of a pressure test is that it is a destructive test and a pass/fail test. Only when an anomaly leaks or breaks is it detected. The higher the test pressure level, the smaller the crack that can be removed and the longer the time period before the test has to be repeated. Therefore, a high-test pressure level is necessary to remove the smaller cracks that might cause failure in service. This is input in the system to determine the maximum allowable operating pressure and to validate it in the system.

Previous Integrity Report(s)

According to a non-limiting embodiment, Previous Integrity report data such as Risk Base Assessment (RBA) or Risk Base Integrity (RBI) reports may be collected, input and validated.

Direct Assessment (DA) Result(s)

According to a non-limiting embodiment, Direct Assessment report data may be collected, input and validated.

In pipeline transportation, pigging is the practice of using pipeline inspection gauges, devices generally referred to as pigs or scrapers, to perform various maintenance operations. There are some pipelines that are currently un-piggable due to valves that will not allow passage of an In-Line Inspection (ILI) tool due to very tight bends or changing diameters along the length of the pipeline. Therefore, other inspection methods have been pursued as a replacement for ILI.

Direct Assessment is really an indirect integrity assessment method utilizing a structured process through which an operator is able to integrate knowledge of the physical characteristics of the pipeline and operating history with the results of inspection, examination and evaluation in order to assess the integrity. Presently, this method has only been developed for metal loss (corrosion anomalies) and therefore has somewhat limited applicability. The outcome of this step is External Corrosion Direct Assessment (ECDA), Internal Corrosion Direct Assessment (ICDA), Stress Corrosion Cracking Direct Assessment (SCCDA) assessment reports.

Root Causes Failure Analysis (RCFA) Report(s)

According to a non-limiting embodiment, Root Causes Failure Analysis report data may be collected, input and validated. Failure analysis is a structured approach used to determine the immediate cause of a failure and help identify contributing factors. Root Causes Failure Analysis helps the asset operator understand future risks, assess mitigating actions, and provide unbiased information to stakeholders.

Failure analysis is a key part of the integrity management system, and the collection of failure data can assist in the safe continued operation of ageing assets.

A broader failure investigation may require a Root Cause Analysis (RCA) to identify weaknesses or gaps within a management system. A root cause analysis can help define corrective actions, prevent recurrence and save costs in the future.

As shown in FIG. 1A, according to a non-limiting embodiment, after the Root Causes Failure Analysis report sub-module, the process may proceed to Sub-module Module 6-6: Free Span Assessment (Offshore).

Flow Assurance & Hydraulic Study Report(s)

According to a non-limiting embodiment, Flow Assurance & Hydraulic Study report data may be collected, input and validated. Given the fact that irregular and unpredictable flow leads to abnormal operations, maintaining consistent production flow in a pipeline is critical to operators. In order to ensure the safe and economical transport of fluids, this process supports customers with a fully integrated flow assurance consultancy by modeling steady state and dynamic flow behavior.

Corrosion, cleaning, and inspection programs require a thorough technical understanding of the thermodynamics and hydraulic fluid behavior in the pipeline, from design to normal operation to decommissioning scenarios. By better analyzing these factors, it is possible to significantly optimize these programs.

Increasing hydrocarbon production from the conventional and unconventional reservoirs in cold environments has led oil companies to face a critical operational challenge of one or more of the fluid flow assurance issues during production and transportation of pipelines. Challenging flow assurance and field development issues affect both well completion design and production operation strategies. Flow assurance issues such as hydrates, wax deposition is one of the important areas being studied today due to the high cost of deep-water exploration and production. The focus of flow assurance analysis and design has often been from flowline entry to the initial separator at the production facility.

The output from any previous flow assurance studies may be input in this process.

Right of Way (ROW), Identified High Consequences Area (HCA), Unusual Sensitive Area (USA) surveys, Drone (Onshore)

According to a non-limiting embodiment, Right of Way (ROW) data, Identified High Consequences Area (HCA) data, Unusual Sensitive Area (USA) survey data, and Drone (Onshore) data may be collected, input and validated. The term High Consequences Area (or HCA) often appears in documents dealing with pipelines and pipeline safety. A location that is specially defined in pipeline safety regulations as an area where pipeline releases could have greater consequences to health and safety or the environment.

A key component of Pipeline and Hazardous Materials Safety Administration (PHMSA)'s pipeline safety regulations is its integrity management (IM) program. For gas transmission pipelines, this program is outlined in Subpart O of 49 CFR part 192 and is based on the concept that pipeline operators need to identify those segments of their pipeline systems that pose the greatest risk to human life, property, and the environment, and to take extra precautions to ensure their safety. These higher-risk areas are known as "HCAs." Each operator is required to survey its entire pipeline system to identify all pipeline segments that could affect HCAs.

Since the greatest risk posed by gas transmission pipelines is the risk of fire and explosion resulting from pipeline leaks and ruptures, gas HCAs consist of highly populated areas and "identified sites" where people regularly gather or live.

An operator's first step in developing a robust IM program is to properly identify and map all HCAs and perform periodic updates to the evaluation process to maintain accurate and current information. Subpart O of part 192 allows operators flexibility in making determinations to identify HCAs by defining two different identification methods, generally referred to as Method 1 or Method 2.

Both methods require the operator to determine "identified sites" and calculate a Potential Impact Radius (PIR), using a formula to calculate the radius of a circle within which the potential failure of a pipeline could have significant impact on people or property. Potential Impact Radius means the radius of a circle within which the potential failure of a pipeline could have significant impact on people or property. While Method 1 includes all pipe segments within Class 3 and Class 4 locations and "identified areas within a PIR in Class 1 and 2 locations," Method 2 includes "identified sites" within a PIR only, regardless of the class location, or the combination of "identified sites" with 20 or more buildings intended for human occupancy.

This is a sub-module to collect all newly identified HCA locations and to update them in a dynamic segmentation module. Right of Way (ROW) data and Drone (Onshore) data may also be collected.

Gap Analysis Report(s)

According to a non-limiting embodiment, Gap Analysis Report data may be collected, input and validated. The gap analysis process implemented in this process to assess oil and gas pipeline asset integrity management program is simple and effective: identify where the reliability program is currently, based on metrics or attributes, identify where it should be to see the program over a specific timeframe, identify the gap between an optimal asset integrity management program and the current program and determine how the gap should be filled using this methodology. This is basically the first step to start the process to identify the bottle necks and road blocks in the PIMS (Pipeline Integrity Management Systems) process.

Previous Leak(s), Failure(s)

According to a non-limiting embodiment, data about Previous leak(s), Failure(s) may be collected, input and validated. Such data may include, but is not limited to, any report from previous leaks or failures including Root Causes Failure Analysis (RCFA), which is an input in the system.

Field Measurement Report(s)

According to a non-limiting embodiment, data about Previous leak(s), Failure(s) may be collected, input and validated. Such data may include, but is not limited to, any Non-Destructive Testing (NDT) or field measurement results as an input in the process.

Remote Operated Vehicle (ROV) and Sonar (Offshore)

According to a non-limiting embodiment, Remote Operated Vehicle (ROV) and Sonar (Offshore) data may be collected, input and validated.

Company Regulatory

According to a non-limiting embodiment, Company Regulatory data may be collected, input and validated.

This standard outlines a process that an operator of a pipeline system can use to assess risks and make decisions about risks in operating a hazardous liquid and gas pipeline in order to reduce both the number of incidents and the adverse effects of errors and incidents. This includes company in-house regulation or national acts to be checked at the end of integrity assessment process.

2) Pipeline Integrity Management Systems (PIMS) Platform Implementation

Figure 1B:
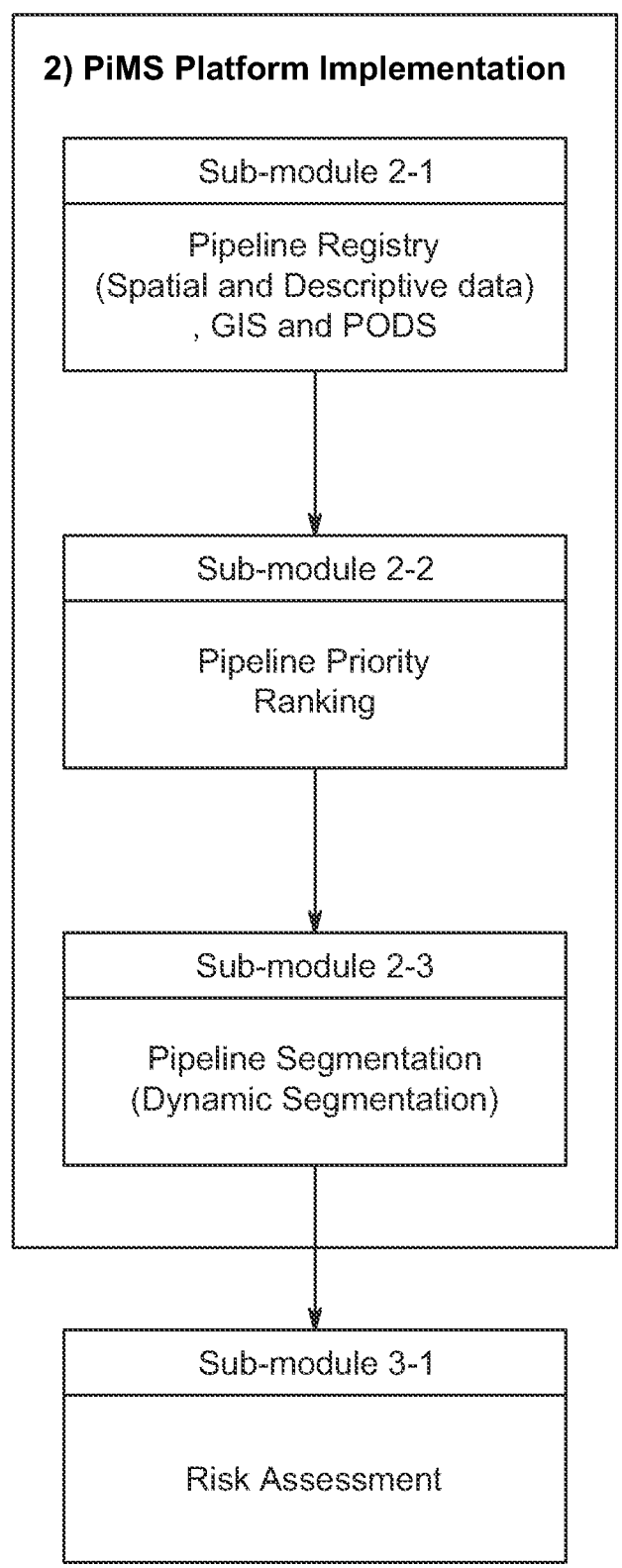

According to a non-limiting embodiment, as shown in FIG. 1B, a Pipeline Integrity Management Systems (PIMS) Platform module may be implemented. Various non-limiting sub-modules of the PIMS Platform module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

Sub-Module 2-1: Pipeline Registry (Spatial and Descriptive Data), Geographic Information System (GIS) and Pipeline Open Data Standard (PODS)

According to a non-limiting embodiment, a Pipeline Registry (Spatial and Descriptive data), Geographic Information System (GIS) and Pipeline Open Data Standard (PODS) sub-module may be implemented. For instance, Pipeline Registry data, Geographic Information System data, and Pipeline Open Data Standard data may be created, referenced, maintained, accessed, analyzed, integrated, stored, displayed or the like.

GIS data can be described as either spatial or descriptive. Spatial data is defined as data that relates to the geographic location of a pipeline or a relationship of objects and features. These can be displayed as points, lines, polygons, or surfaces and represent cities, rivers, pipeline route and crossings, or elevation.

A point is defined as one coordinate pair. In other words, it has a location that can be in X, Y coordinates, latitude/longitude, or Universal Transverse Mercator (UTM)s. Points are used to represent features that are too small to be represented by line or polygon. These can be a village, a location of pipeline valves, or crossings of one of pipeline. Points are easily acquired in the field with the use of a Global Positioning system (GPS).

A line is a series of points that are connected by an arc. Lines are commonly used to represent linear features that are too narrow to be represented by a polygon. These may include a Pipeline route, roads or rivers.

A polygon is a series of points and arcs that begin and end at the same location and have a defined area. Polygons can be used to represent administrative boundaries, HCA in pipeline, stations, etc.

Descriptive data are the characteristics that are associated with spatial data. In GIS, descriptive data are often referred to as attribute data.

There are three types of descriptive data:

1. Categorical data are discrete data with a definable boundary. With vector data, this data is often stored as a text string such as the name of a pipeline. For raster data, the data is usually stored for each cell as a numerical value that groups the cell into a class or category.

2. Continuous data are non-discreet data displayed as a surface gradient. These data are usually displayed in a raster, such as elevation or precipitation, with floating point values for each cell.

3. Metadata are information about the spatial and descriptive data types. Metadata provides documentation on who created the data, how the data was created, when the data was created, the data format, and projection of the data.

As shown in FIG. 1B, according to a non-limiting embodiment, after the Pipeline Registry (Spatial and Descriptive data), Geographic Information System (GIS) and Pipeline Open Data Standard (PODS) sub-module, the process flow may proceed to a Pipeline Priority Ranking sub-module.

Sub-Module 2-2: Pipeline Priority Ranking

According to a non-limiting embodiment, a Pipeline Priority Ranking sub-module may be implemented. For instance, Pipeline Priority Ranking data may be created, referenced, maintained, accessed, analyzed, integrated, stored, displayed or the like.

Integrity maintenance of the aging hydrocarbon pipeline network is a prime concern for transmission companies. With the variety of existing pipeline inspection and protection approaches and the constant improvements in inspection technologies, pipeline operators have many tools at their disposal to ensure the continued safe operation of their systems. Because pipeline systems are usually large, and maintenance budgets are limited by constraints of economic viability, operators must decide on how maintenance resources are best allocated.

According to a non-limiting embodiment, a risk-based methodology to address the question of optimal allocation of maintenance resources is presented. The methodology is based on two major steps: a) to rank different segments of the pipeline with respect to priority for increased maintenance; and b) to select an optimal set of maintenance actions for high priority segments. Decisions regarding segment prioritization and maintenance optimization for a given segment are based on the level of risk associated with a given segment and the risk: reduction achieved by different maintenance actions.

Figure 4:
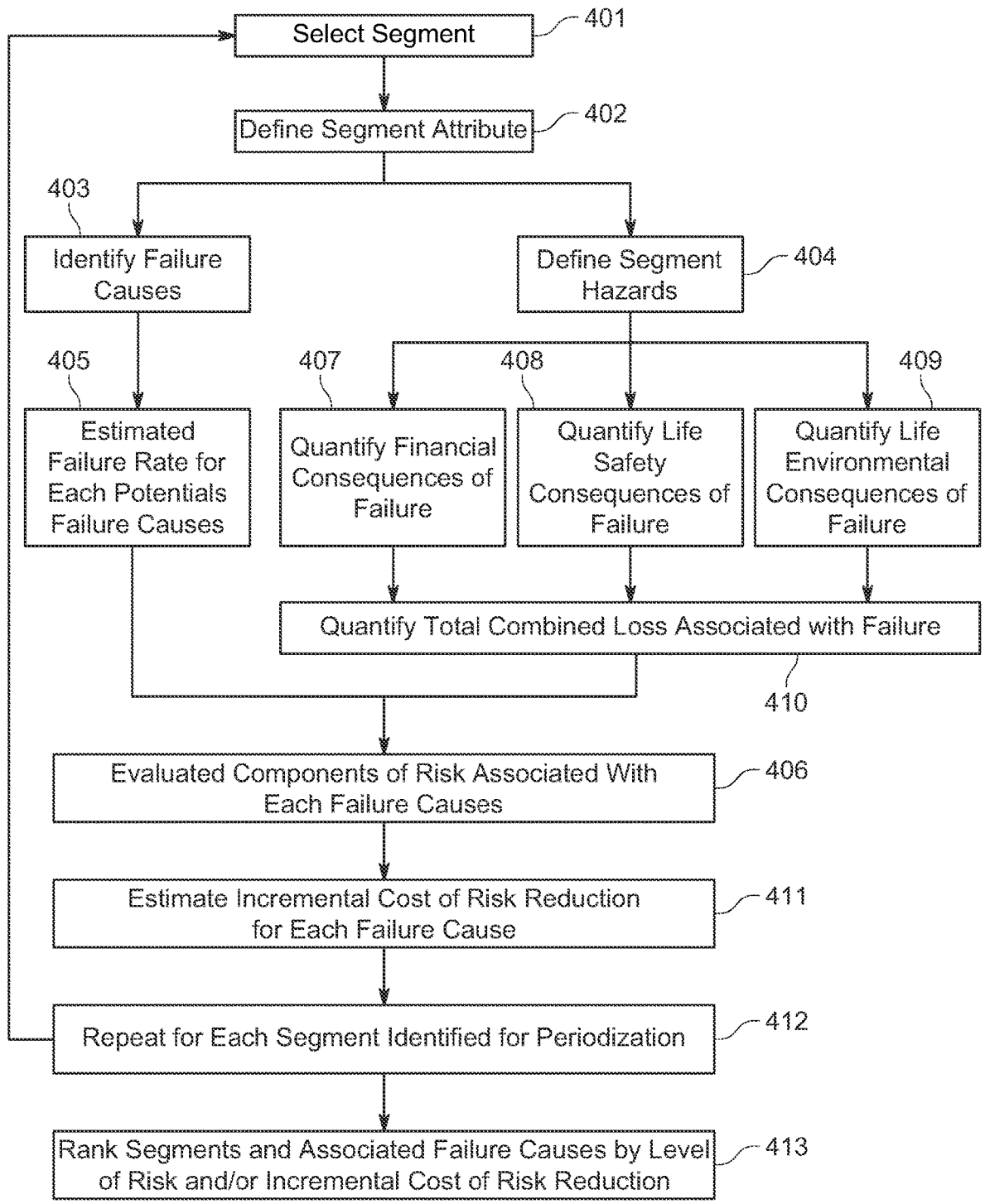
FIG. 4 shows a flow chart for Pipeline System Prioritization according to a non-limiting embodiment.

FIG. 4 shows a flow chart for Pipeline System Prioritization according to a non-limiting embodiment. As shown in FIG. 4, operation 401 selects a segment and then operation 402 defines a segment attribute. Then, either operation 403 identifies failure causes or operation 404 defines segment hazards.

After operation 403, operation 405 estimates a failure rate for each of the potential failure cause and then, in operation 406, evaluated components of risk are associated with each of the failure causes.

After operation 404, operation 407, operation 408 and operation 409 are performed. Operation 407 quantifies financial consequences of failure. Operation 408 quantifies life safety consequences of failure. Operation 409 quantifies life environmental consequences of failure. After operation 407, operation 408 and operation 409 are performed, then operation 410 quantifies the total combined loss associated with failure and then operation 406 (discussed above) is performed.

After operation 406, operation 411 estimates the incremental cost of risk reduction for each failure cause. Operation 412 repeats for each segment identified for periodization. Finally, operation 413 ranks segments and associated failure causes by level of risk and/or incremental cost of risk reduction.

As shown in FIG. 1B, according to a non-limiting embodiment, after the Pipeline Priority Ranking sub-module, the process flow may proceed to a Pipeline Segmentation (Dynamic Segmentation) sub-module.

Sub-Module 2-3: Pipeline Segmentation (Dynamic Segmentation)

According to a non-limiting embodiment, a Pipeline Segmentation (Dynamic Segmentation) sub-module may be implemented. For instance, Pipeline Segmentation (Dynamic Segmentation) data may be created, referenced, maintained, accessed, analyzed, integrated, stored, displayed or the like.

Large structures are systems composed by a significant number of components with parallel or series distributions. How these components fail and interact, aggravate the complexity of the main structure reliability calculation. Some methods commonly proposed to reduce this complexity by dividing the system into segments of similar properties using dynamic or static approaches. Dynamic segmentations may depend on how aggressive the structure's surrounding conditions are (e.g., the soil properties). Static segmentations could be given by fixed distances. However, in a few cases, these divisions follow a condition-based approach. This process focuses on an alternative dynamic segmentation to identify preliminary critical segments based on a change point approach and data obtained from inspections. Change point algorithms have been used to determine changes in spatial measurements for a further reliability evaluation with appropriate limit state functions.

This work focuses on onshore and offshore pipelines subjected to corrosion defects based on information obtained from In-Line Inspections (ILI). Oil and gas pipelines cross through a variety of soils, water corridors, and densely populated areas promoting spatial-dependent degradation processes like corrosion. ILI inspections are commonly used to identify the condition of the pipeline in terms of the remaining wall and location of metal loss at the inner and outer walls by using magnetic or ultrasonic instruments. Based on a burst failure limit state, the segments obtained with the change points approach are compared with a soil and static segmentations. The results indicate that the proposed approach could identify the main critical points of the pipeline using segments with statistical significance.

As shown in FIG. 1B, according to a non-limiting embodiment, after the Pipeline Segmentation (Dynamic Segmentation), the process flow may proceed to sub-module 3-1. Risk Assessment.

3) Risk Assessment

Figure 1C:
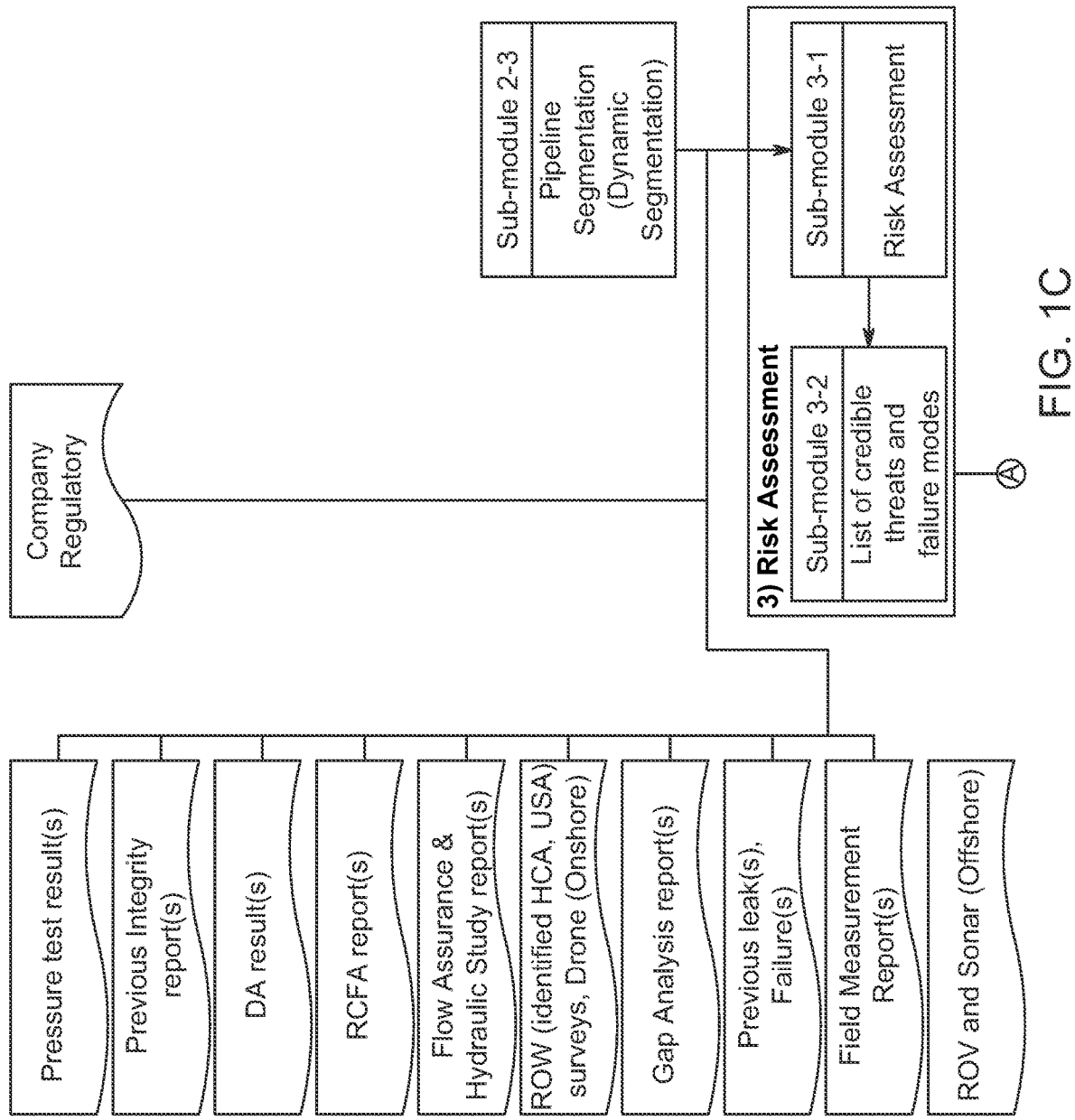
Figure 1C:
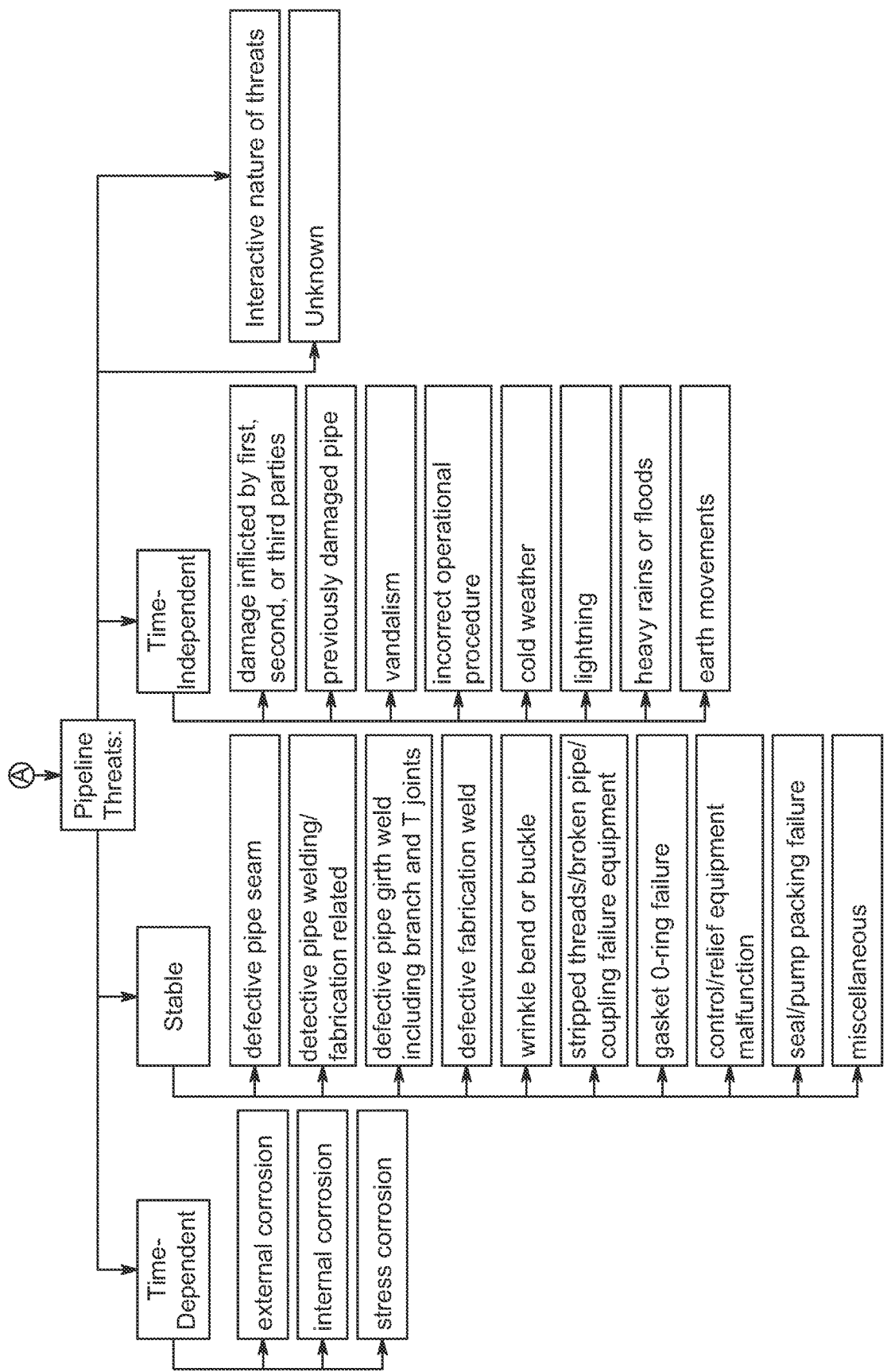

According to a non-limiting embodiment, as shown in FIG. 1C, a Risk Assessment module may be implemented. Various non-limiting sub-modules of the Risk Assessment module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

Sub-Module 3-1: Risk Assessment

According to a non-limiting embodiment, a Risk Assessment sub-module may be implemented. It is possible to install a leak detection system, or to survey the pipeline using an intelligent pig, and hope that all the problems will be solved. Both of these may ultimately be required but the starting point should be to identify the risks to which the environment and pipeline operators are exposed, establish the base cause(s) of the incidents leading to the risks and identify and systematically evaluate cost effective solutions.

Risk is the chance of an undesired impact on the public or environment as a result of some event occurring. So far as pipelines are concerned, risk is the chance of fatality or environmental damage occurring following an accidental release of the inventory. According to a non-limiting embodiment, evaluating risk is a systematic process comprising four steps which are:

1. Identifying the potential events which could cause a release of inventory from the system (hazard identification);
2. Predicting the likelihood of such events occurring by comparison with the historical rate at which such incidents have occurred on similar systems (probability analysis);
3. Assessing the hazard or environmental impact of the release events identified (consequence analysis); and
4. Presenting risk as a combination of likelihood and consequence of the potential accidents (risk estimation).

Further stages in overall risk management concern the assessment of the acceptability of such events and the analysis of the cost and benefit of proposed risk reduction measures.

Sub-Module 3-2: List of Credible Threats and Failure Modes

According to a non-limiting embodiment, as shown in FIG. 1C, a List of Credible Threats and Failure Modes sub-module may be implemented. This sub-module may identify all credible threats (e.g., among 23 pipeline threats) and mainly focus on those threats and failure modes. A non-limiting embodiment of 23 example pipeline threats are provided below:

(1) External corrosion (e.g., Galvanic Corrosion, Stray Corrosion, Microbiological Corrosion, Selective Seam Corrosion, etc. . . . );
(2) Internal corrosion (e.g., Corrosive Commodity, Acid Water, Microbiological Corrosion, Erosion, etc. . . . );
(3) Stress corrosion cracking, Cracks;
(4) Manufacturing-related defects, defective pipe seam;
(5) Manufacturing-related defects, defective pipe;
(6) Defective pipe girth weld including branch and T joints;
(7) Defective fabrication weld;
(8) Wrinkle bend or buckle;
(9) Stripped threads/broken pipe/coupling failure;
(10) Equipment, gasket O-ring failure;
(11) Equipment, control/relief equipment malfunction;
(12) Equipment, seal/pump packing failure;
(13) Equipment, miscellaneous;
(14) Damage inflicted by first, second, or third parties (instantaneous/immediate failure);
(15) Previously damaged pipe (such as dents and/or gouges) (delayed failure mode);
(16) Vandalism;
(17) Incorrect operational procedure (Damaged by operator or contractor, Overpressure, not installed properly;
(18) Cold weather;
(19) Lightning;
(20) Heavy rains or floods;
(21) Earth movements;
(22) Unknown; and
(23) Interactive nature of threats Table 1 (below) shows an illustration of pipeline threats according to a non-limiting embodiment.

TABLE 1

| Pipeline Threats |
| --- |
| (a) Time Dependent |
| (1) external corrosion (Galvanic Corrosion, Stray Corrosion, Microbiological Corrosion, Selective Seam Corrosion, . . . ) |
| (2) internal corrosion (Corrosive Commodity, Acid Water, Microbiological Corrosion, Erosion, . . . ) |
| (3) stress corrosion cracking, Cracks |

TABLE 1-continued

Pipeline Threats (b) Stable
    manufacturing-related defects
        (4) defective pipe seam
        (5) defective pipe
    welding/fabrication related
        (6) defective pipe girth weld including branch and T joints
        (7) defective fabrication weld
        (8) wrinkle bend or buckle
        (9) stripped threads/broken pipe/coupling failure
    equipment
        (10) gasket O-ring failure
        (11) control/relief equipment malfunction
        (12) seal/pump packing failure
        (13) miscellaneous
(c) Time Independent
    third-party/mechanical damage
        (14) damage inflicted by first, second, or third parties
            (instantaneous/immediate failure)
        (15) previously damaged pipe (such as dents and/or gouges)
            (delayed failure mode)
        (16) vandalism
        (17) incorrect operational procedure (Damaged by operator
            or contractor, Overpressure, not installed properly
            weather-related and outside force
        (18) cold weather
        (19) lightning
        (20) heavy rains or floods
        (21) earth movements
        (22) Unknown
        (23) Interactive nature of threats As shown in Table 1, pipeline threats may be: (a) Time Dependent, (b) Stable or (c) Time Independent. Time Dependent pipeline threats may include, but are not limited to (1) external corrosion, (2) internal corrosion and (3) stress corrosion cracking. As shown in Table 1, (1) external corrosion may include, but is not limited to: galvanic corrosion, stray corrosion, microbiological corrosion, selective steam corrosion, etc. Moreover, (2) internal corrosion may include, but is not limited to: corrosive commodity, acid water, microbiological corrosion, erosion, etc.

According to the non-limiting embodiment shown in Table 1, (b) Stable pipeline threats may include, but are not limited to, manufacturing-related defects, such as (4) defective pipe seam and (5) defective pipe. As shown in Table 1, (b) Stable pipeline threats may also include, but are not limited to, welding/fabrication related defects, such as (6) defective pipe girth weld including branch and T joints, (7) defective fabrication weld, (8) wrinkle bend or buckle and (9) stripped threads/broken pipe/coupling failure. Finally, as shown in Table 1, (b) Stable pipeline threats may include, but are not limited to, equipment related pipeline threats, such as (10) gasket O-ring failure, (11) control/relief equipment malfunction, (12) seal/pump packing failure and (13) miscellaneous.

According to the non-limiting embodiment shown in Table 1, (c) Time Independent pipeline threats may include, but are not limited to, (14) damage inflicted by first, second, or third parties (instantaneous/immediate failure), (15) previously damaged pipe, such as dents and/or gouges (delayed failure mode), (16) vandalism, (17) incorrect operational procedure (e.g., damaged by an operator or contractor, overpressure, not installed properly, weather-related and outside force), (18) cold weather, (19) lightning, (20) heavy rains or floods, (21) earth movements, (22) unknown and (23) interactive nature of threats.

4) In-Line Inspection (ILI) Enterprise

Figure 1D:
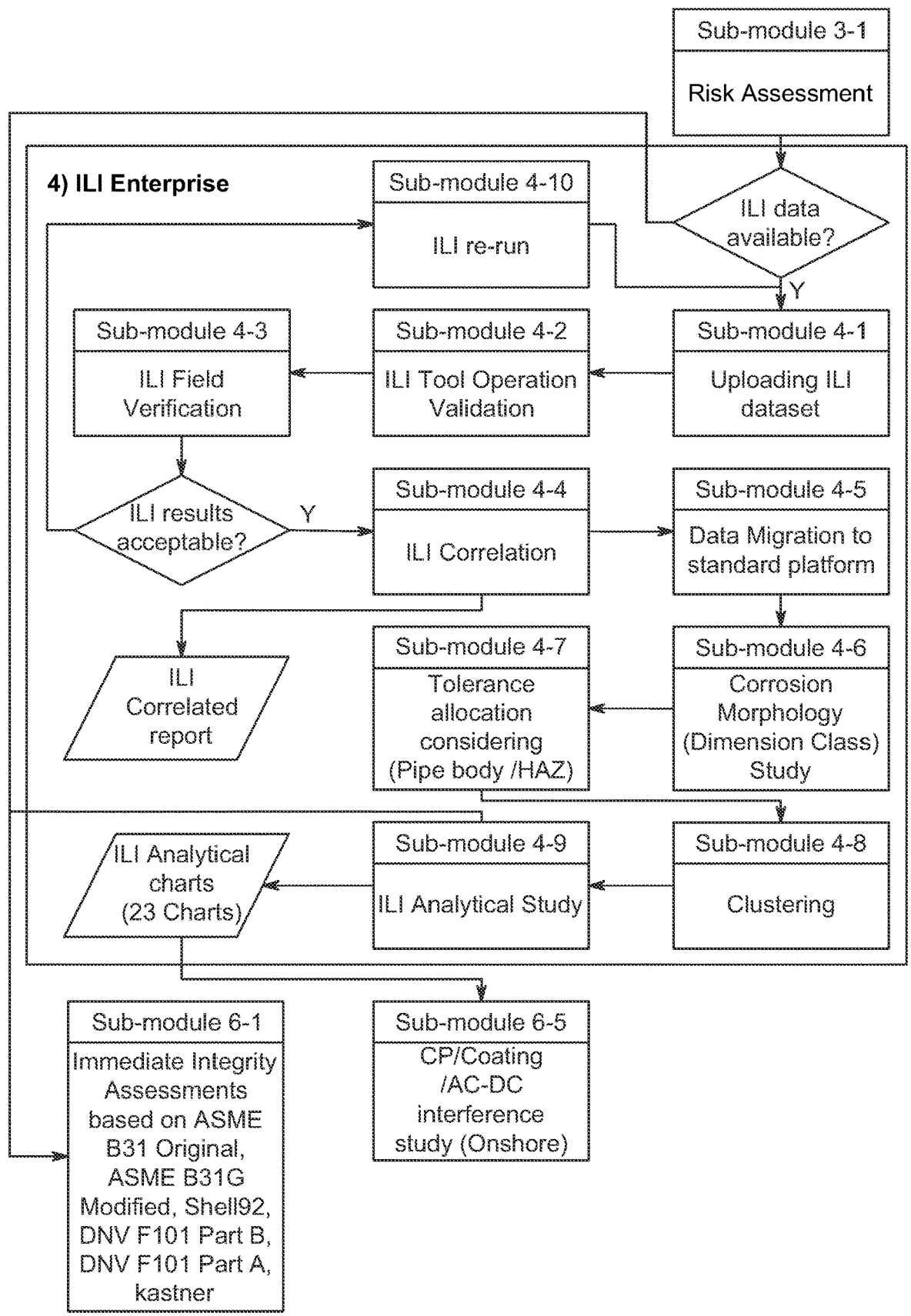

According to a non-limiting embodiment, as shown in FIG. 1D, after the Risk Assessment module, an In-Line Inspection (ILI) Enterprise module may be implemented. Various non-limiting sub-modules of the ILI Enterprise module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

Sub-Module 4-1: Uploading ILI Dataset

According to a non-limiting embodiment, as shown in FIG. 1D, after the Risk Assessment module, if ILI data is available, then an Uploading ILI dataset sub-module may be implemented. To upload ILI data in a standard platform, it needs a proper system to transfer and translate the data and units and convert them to one standard platform.

On the other hand, if ILI data is not available, then the process flow may proceed to Sub-Module 6-1: Immediate Integrity Assessments based on ASME B31 Original, ASME B31G Modified, Shel192, DNV F101 Part B, DNV F101 Part A, Kastner.

Sub-Module 4-2: ILI Tool Operation Validation

According to a non-limiting embodiment, an ILI Tool Operation Validation sub-module may be implemented. The objective of In-Line Inspection (ILI) is to obtain data on the pipeline condition as part of the baseline and/or revalidation process. A key part of the process is verification of the ILI tool performance and analysis process through the use of field verification.

The quality and consistency of data obtained from the field is important for statistical verification of the performance of the ILI processes. In many cases the operator is only focused on confirmation of a reported feature rather than the performance of the overall inspection process. This step may validate the process and performance of the ILI tool.

This sub-module specifies the requirements and detailed method statement for ILI operational reports in the ILI suite. It covers the basic requirements for ILI reports such as Sensor loss plots, Magnetization level assessment, etc., as a supplementary assessment for the standard ILI platform.

This sub-module specifies the advised operational and reporting requirements for tools to be used for geometric measurement, pipeline mapping, metal loss, cracks or other anomaly detection during their passage through steel pipelines. The tools may pass through the pipeline driven by the flow of a medium or may be towed by a vehicle or cable. The tools may be automatic and self-contained or may be operated from outside the pipeline via a data and power link. But regardless of technique and brand of ILI tool, this sub-module covers minimum acceptance criteria for ILI operation before any data evaluation.

This algorithm has been provided based on Pipeline Operator Forum (POF) standard and a Pipeline Open Data Standard (PODS) database.

This sub-module is intended to serve as a generic in-line-inspection specification and thereby cannot cover all pipeline or pipeline operator specific issues. To support the pipeline operator in specifying/detailing some optional items in this process, the IT team should be flexible for any change during runs for different pipeline cases.

From the previous Sub-module 4-1: Uploading ILI dataset, an interim spreadsheet is generated as a standard platform to be translated from different ILI reports and vendor templates and also, most of the analytical reports and assessments have been captured.

The tool specifications shall be given. In addition, the following operational data shall be provided, whereby each type of tool that has been used shall be described separately:

Data sheet of used tool(s) with e.g., serial number, software version etc.,

The data-sampling frequency or distance,

The detection threshold,

The reporting threshold, normally taken at 90% POD if not specified otherwise,

A tool velocity plot over the length of the pipeline,

Optionally, a pressure and/or temperature plot over the length of the pipeline,

Defective transducer statistics and, in case of ultrasonic pigs, echo loss statistics, In the case of Magnetic Flux Leakage (MFL) tools, a plot of the magnetic field strength H in kA/m over the length of the pipeline measured at the inner surface of the pipe, Tool operational data statement that can be used to consider a re-run.

Sub-Module 4-3: ILI Field Verification

According to a non-limiting embodiment, an ILI Field Verification sub-module may be implemented. An ILI project is not complete until the reported features have been verified in the field. The process which is followed in the field to achieve this is important as inappropriate inspection techniques in the field can invalidate an otherwise valid report.

Field verification of reported features has two important aspects as this helps confirm:

The reported features confirming the condition of the line to operator and helps support any actions that may be taken.

The tool performance for use on other lines where dig verification is not possible.

It is necessary to determine the performance of the inspection, in order to conduct the required preventative maintenance plans with the certainty of risk required by the operator. Factors of Safety (FOS) can only be used effectively if the tolerances being used to calculate the FOS actually match those provided in the inspection report or are more conservative in nature. It is not acceptable to use sizing tolerances that are not conservative, which means the actual measured dimensions are greater than those predicted even with the tool vendors tolerance added.

Most ILI suppliers will provide support for field verification activities. The ILI suppliers are not just interested in when the ILI tool has not performed to specification. They need good quality field data to help verify the tool performance specifications for a range of feature types.

To achieve consistency with data collection it is necessary to set standards and protocols that must be followed.

This requires trained field personnel to gather the data with the required accuracy and competency so that the results can be relied upon. The techniques and equipment used must be tested and certified in calibration. The calibration and device tolerances must be taken into account when evaluating the results.

This sub-module may verify the results of the ILI run and to accept the step to proceed to further steps in the entire process.

As shown in FIG. 1D, after the ILI Field Verification sub-module, if the ILI results are acceptable, then the process flow may proceed to Sub-Module 4-4: ILI Correlation.

On the other hand, if the ILI results are not acceptable, then the process flow may proceed to Sub-Module 4-10: ILI Re-Run.

Sub-Module 4-4: ILI Correlation

According to a non-limiting embodiment, an ILI Correlation sub-module may be implemented. In particular, a Correlated ILI report may be generated based on field verification results. This report may be the final report to be assessed in this sub-module.

Sub-Module 4-5: Data Migration to Standard Platform

According to a non-limiting embodiment, an Data Migration to Standard Platform sub-module may be implemented. This process specifies the advised reporting requirement to the pipeline integrity team to be used for geometric measurement, pipeline mapping, metal loss, crack or other anomaly detection during the ILI process and reporting. In an existing system, the end user cannot import different types of ILI reports. It is a challenge to translate different columns in different reports. Moreover, in many cases the data fields need to be translated into a standard platform. For example, for defects orientation, some ILI service providers are reporting based on degree, others with o'clock orientation. Some companies are reporting start and end points of defects and the deepest metal loss point, but others just report a deepest location in general metal loss. Plus, clustering rules and defects interaction criteria are different in ILI companies, and it could be a challenge to understand and use them in other ILI modules like in analytical reports, Fitness-for-Service (FFS), Defect assessment, etc.

Therefore, for further assessments in the system, it is a must to translate all types of reports into a single standard data entry format (standard ILI platform).

This sub-module may serve as a generic and standard platform to translate and convert all types of ILI reports into a single standard platform for ILI.

For this challenge, the industry needs an interim spreadsheet, to translate different ILI vendors to be able to import in standard suite and to conduct further assessments.

It may be one spreadsheet (standard excel format) in a comma-separated values (CSV) as a system standard data entry format for all kind of ILI reports and service providers.

According to a non-limiting embodiment, this standard data entry form may be compatible with the PODS 7.0 data model.

This sub-module or element of the entire process may upload ILI data in a standard platform. It needs proper system to transfer and translate the data and units and to convert them to one standard platform.

Sub-Module 4-6: Corrosion Morphology (Dimension Class) Study

According to a non-limiting embodiment, a Corrosion Morphology (Dimension Class) Study sub-module may be implemented to determine the dimension class and morphology of metal loss corrosions (pin-hole, pitting, General corrosion, axial slotting, axial grooving, circumferential slotting, circumferential grooving).

Sub-Module 4-7: Tolerance Allocation Considering (Pipe Body/Heat Affected Zone (HAZ))

According to a non-limiting embodiment, a Tolerance Allocation Considering (Pipe body/Heat Affected Zone (HAZ)) sub-module may be implemented to consider ILI tool tolerances which are different for the pipe body and HAZ area. For instance, the ILI service provider reports the tolerances for Caliper and Magnetic Flux Leakage (MFL) tools as outlined in ILI tables. Typically, these tool tolerances are added to the measured dimensions of an anomaly when assessing its static strength. Fitness For Purpose (FFP)

assessments are performed in this process once with and once without consideration of ILI tool tolerances.

The ILI company classifies features in accordance with the Pipeline Operators Forum (POF) specification based on their aspect ratio (width×length), prior to applying the appropriate tolerance.

Sub-Module 4-8: Clustering

According to a non-limiting embodiment, a Clustering sub-module may be implemented. Following inline inspection of a pipeline, the interaction criterion used in subsequent defect assessment is agreed between the inspection vendor and the pipeline operator. The first process, referred to as "'boxing", is where a box is drawn around each feature. The second process, referred to as "clustering", is a process to determine whether boxes located in close proximity to one another should be considered as a single corrosion feature. Finally, a decision has to be made on whether adjacent defect clusters will interact or not. Remaining strength predictions of the corroded pipeline will be very sensitive to the interaction criterion used and the method.

To date, most of the Pipeline Integrity and ILI software, work on corrosion assessment on studying isolated defects, primarily of similar depths. The failure pressure of an interacting defect will be lower than that for an isolated defect because it will interact with neighbouring defects. Both ASME B31G and RSTRENG do not provide guidance for grouping and assessing metal loss defects that may interact. Some guidance is given in BS 7910 and DNVGL RP-F101 and indeed some pipeline operators have developed their own criterion for grouping defects. In general, existing guidance is based on limited empirical or semi-empirical derived methods that still require judgment from the analyst.

This process has recognized that a robust method for grouping and assessing metal loss defects that may interact is required by pipeline integrity engineer. There is a sub-module in the software which enables user to select interaction criteria (clustering rules) utilizing different dimension rules and also even material property to apply clustering in 2 different levels and apply immediate and future integrity assessment based on new grouped sizes (New length, width and depth).

There is a unique option in this sub-module that enables a pipeline integrity engineer to increase sensitivity of clustering (select more conservative rule and level) in High Consequence Areas (HCA) and also in Unusual Sensitive Areas (USA).

Not only the clustering rule to be selected by the pipeline software user is an option for pipeline integrity engineer, but also the selection of with and without applying tolerances and also different standards (Original ASME B31G, Modified B31G, Shel192, DNVGL RP F101, Part B and DNVGL RP F101 Part A with Axial loading) are available options to be selected. Next to all, a user can filter specific location of pipeline or specific orientation for detail studies.

Sub-Module 4-9: ILI Analytical Study

According to a non-limiting embodiment, an ILI Analytical Study sub-module may be implemented. This sub-module specifies the requirements and detailed method statement for analytical reports in the ILI suite. It covers the basic analytical reports for ILI reports such as distribution plots, high level analysis, distribution of orientation for different category of defects, etc., all based on the standard ILI platform.

The ILI suite for Pipelines shall be very comprehensive, interactive client software that provides access to the Inspection Data, database information and complete details of the inspection.

This element will provide thorough functionality to manage and maintain the pipeline facility and generate any required reports, charts or graphs regardless of ILI service provider and any brand.

ILI suite for Pipeline features:
Access to all Inspection Data,
    Visualization of Inspection Data in various display formats with scroll functions,
    Access to database files for all features, fittings, markers, welds, bends and any other pipeline installation detected by the tool or input by the operator,
    Sorting and filtering functions to manipulate the data,
    Pipe Tally including all database information,
    List functions to design, generate, sort and filter client specific lists,
    Weld and feature Location Sheet for any selected feature,
    Statistical functions for anomaly or feature distribution or classification,
    On-screen search, zoom and scroll functions,
    Client specific calculators for remaining strength of pipe,
    Client specific methods to calculate defect interaction,
    Symbolic Pipe View to aid in data navigation,
    Printing and Exporting functions.

From a previous sub-module there is an interim spreadsheet as a standard platform to be translated from different ILI reports and vendor templates. After this translation (conversion), the system engine is able to start further analytical assessments for a selected data set as per this method statement.

All these analyses will be based on a standard spreadsheet (standard excel format) in CSV as a base for all types of ILI reports.

It is important to have consistent and reliable standards. The anomalies must be accurately measured in length, width and depth in ILI reports.

When evaluating anomalies, it is very important to understand the extent of the anomaly and how its interaction with adjacent anomalies is accounted for in the report. A best practice is to measure the distance from the upstream girth weld and to paint a box equivalent to the reported dimensions, including the tolerances and taking into account the interaction (of the boxes in a cluster). The accuracy of the inspection can then be easily recognized and documented by photography. The different types of anomalies are evaluated against the appropriate standard or code for that specific type of anomaly include (but are not limited to):

Metal loss features and corrosion:
    ASME B31.G—Manual for Determining the Remaining Strength of Corroded Pipelines: A Supplement to ASME B 31 Code for Pressure Piping; published by ASME International,
    Rstreng-5 (Modified ASME B31 G)—Pipeline Research Council International (PRCI) contract PR-218-9304, Continued validation of Rstreng" (December 1996),
    DNV RP-F101,
    Shell 92,
    BS 7910 Annex G,
    API 579 (Sections 4-5).

Cracks:
    API 579 (Section 9),
    BS7910,
    DNV pressure calculation.

The interaction rules to be used can be completed in previous steps.

As shown in FIG. 1D, according to a non-limiting embodiment, the Sub-Module 4-9: ILI Analytical Study may result in ILI analytical charts (23 charts) and then the process flow may proceed to Sub-Module 6-5: CP/Coating/Alternating Current (AC)-Direct Current (DC) interference study (Onshore).

As shown in FIG. 1D, according to a non-limiting embodiment, after Sub-Module 4-9: ILI Analytical Study, the process flow may proceed to Sub-Module 6-1: Immediate Integrity Assessments based on ASME B31 Original, ASME B31G Modified, Shel192, DNV F101 Part B, DNV F101 Part A, Kastner.

Figure 5:
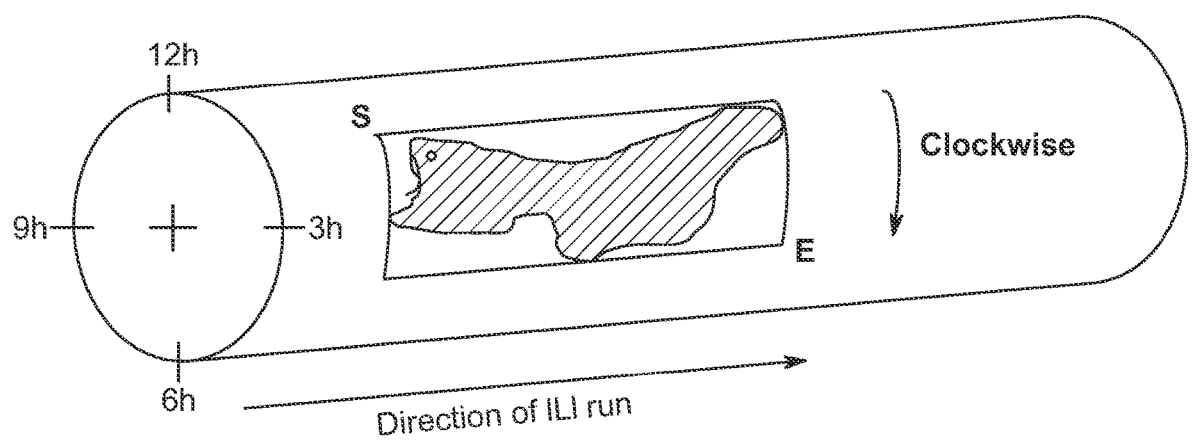
FIG. 5 shows an illustration of parameters describing location and dimension of a metal loss feature in In-Line Inspection (ILI) suite software according to a non-limiting embodiment.
Figure 7:
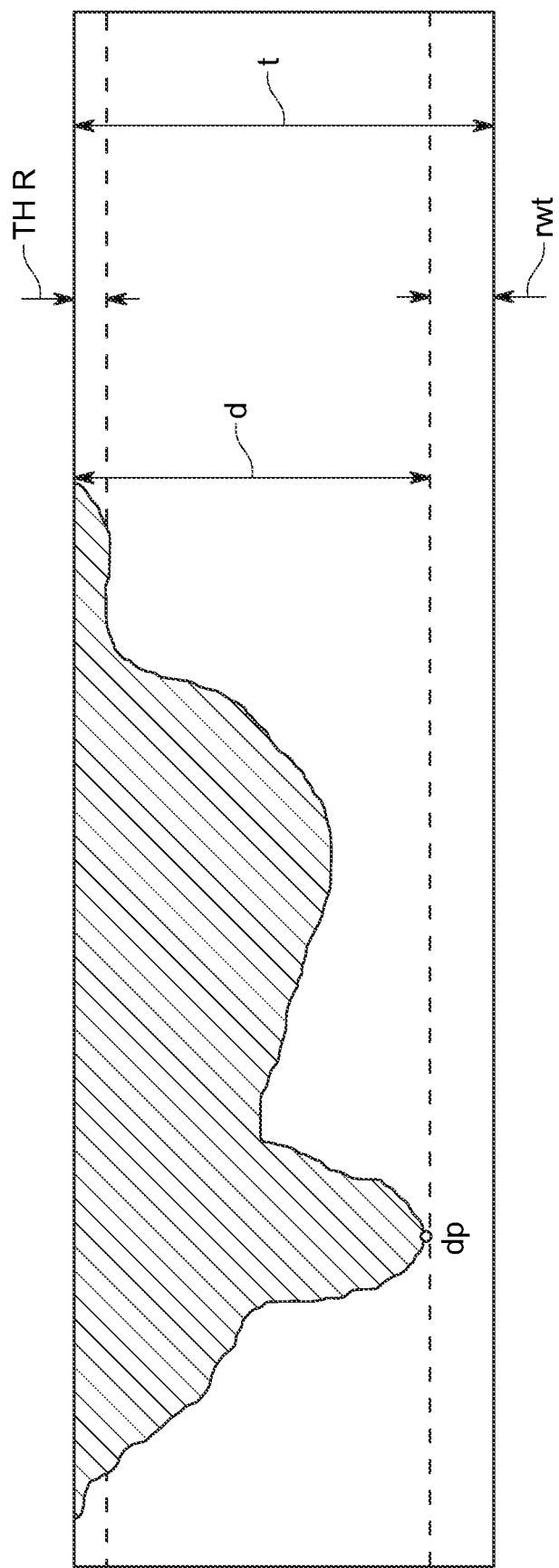
FIG. 7 shows an illustration of the definition of wall thicknesses according to a non-limiting embodiment.

FIG. 5 shows an illustration of parameters describing the location and dimensions of a metal loss feature in the ILI suite according to a non-limiting embodiment. The parameters of anomalies are length "L", width "w" and depth "d". The starting point, S, and the dimension of an anomaly are defined as illustrated in FIG. 7 looking in the ILI run direction. Start and end points are diagonally in a rectangle enclosing the anomaly. The depth represents the deepest point reported within the rectangle.

According to the non-limiting embodiment shown in FIG. 5, the start position of the anomaly has a lower clock position than the end position. Anomalies crossing the 0:00 o'clock position have a higher clock position at the start. Full circumferential anomalies are reported with S at 0:00 o'clock. According to the non-limiting embodiment shown in FIG. 5, the highest clock position shall be 11:59.

Figure 6:
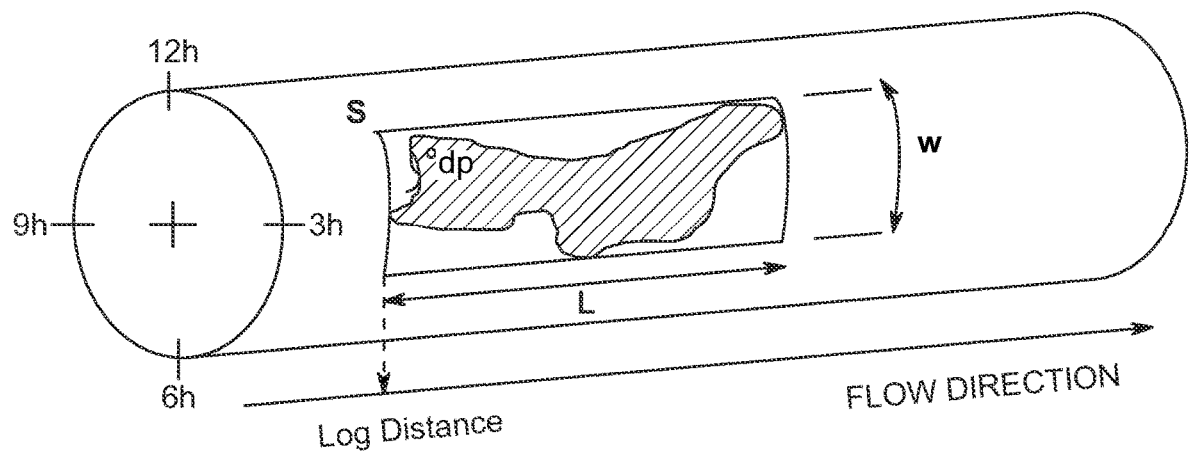
FIG. 6 shows an illustration of defect assessment parameters describing location and dimension of a metal loss feature in In-Line Inspection (ILI) suite software according to a non-limiting embodiment.

FIG. 6 shows an illustration of defect assessment parameters describing the location and dimensions of a metal loss feature in ILI suite according to a non-limiting embodiment.

The location of an anomaly is given with S-Log distance and S-Position as described with reference to FIG. 6.

The length of a metal loss anomaly is given by its projected length on the longitudinally axis of the pipe, the width of a metal loss anomaly is given by its projected length on the circumference of the pipe. The depth of a metal loss anomaly is determined by maximum wall loss (dP).

S-Log=Log distance [m]
S-Position=o'clock position [h]
L=Anomaly length [mm]
W=Anomaly width [mm]
t=reference wall thickness [mm]
d=anomaly depth [mm]
rwt=remaining wall thickness [mm]
TH_R=reporting threshold [% of t]
dP=deepest point of a metal loss anomaly
t(calc)=calculated wall thickness [mm]

The 'Magnetic Flux Leakage (MFL) Method' accesses the relative depth d/t which is calculated on the basis of the tool calibration.

FIG. 7 shows an illustration of the definition of wall thicknesses according to a non-limiting embodiment.

Both values d/t and t (calc) are independent and specified separately with concern to their accuracy.

Important consequence: for field comparison measurements it must be ensured that the reference wall thickness surrounding the anomaly is used to calculate the relative depth of the anomaly in order to apply the specified MFL depth accuracy. If this comparison will be based on the MFL calculated wall thickness the specified accuracy interval is enlarged following the law of error, i.e., the relative errors specified for the wall thickness and the relative anomaly depth must be summarized.

Figure 8:
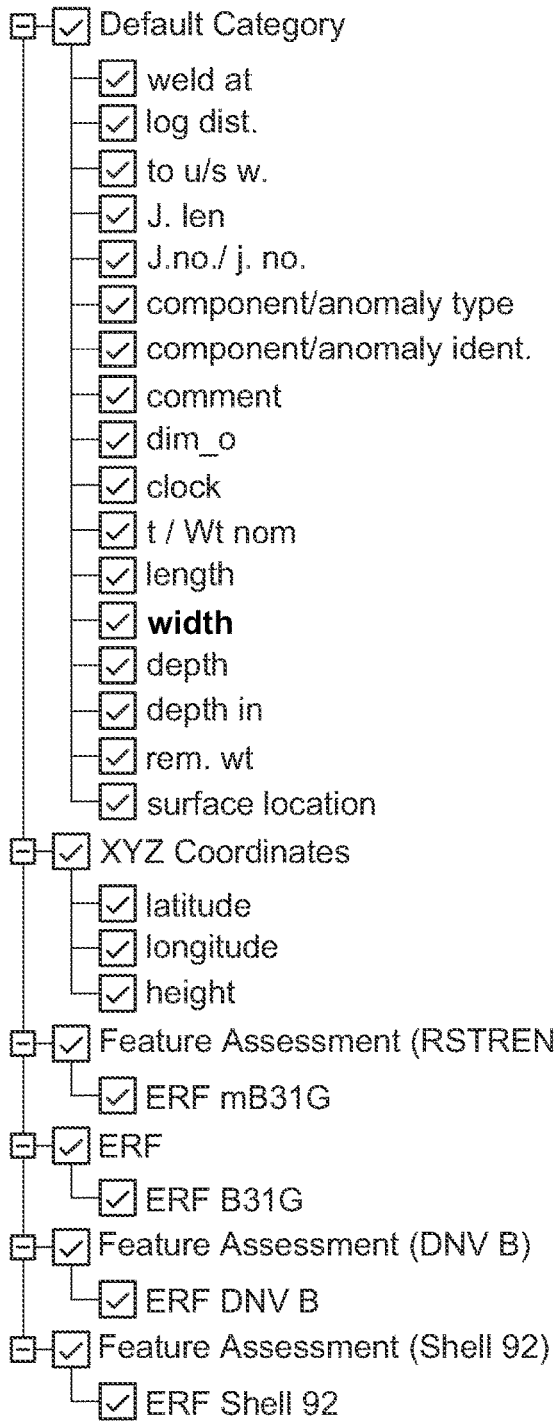
FIG. 8 shows a list of descriptive data for every single corrosion metal loss feature to be used in filtering and sorting of features along the pipeline.

FIG. 8 shows various features according to a non-limiting embodiment. As shown in FIG. 8, features can be divided into component features and anomaly features. For example, as shown in FIG. 8, features may be identified as report structure, terminology and abbreviations and Column Feature type. The type of features shall be further identified in accordance with FIG. 8 including but not limited to Report structure, terminology and abbreviations, Column Feature identification.

According to a non-limiting embodiment, software shall have ability to show the columns in short text (abbreviations). It includes 23 very practical charts for distribution of internal and external metal loss corrosion and other anomalies along the pipeline route and in different segments. One non-limiting embodiment showing such 23 charts is shown below in Table 1:

TABLE 1

| Chart Number | Title of Chart | X-Axis Title | Sub X-axis Title | Y-axis Title | Z-axis Title | X-axis Domain |
|---|---|---|---|---|---|---|
| 1 | Line pipe distribution by Joint manufacturing type | Joint manufacturing type | | Number of joints | | COWL COWH CW DSAW LFW LW HFW SPIRAL ERW ERW-HF SEAMLESS |
| 2 | Line pipe distribution by wall thickness | Number of joints | | Nominal Wall thickness [mm] | | |
| 3 | Line pipe distribution by joint length | Number of joints | | Joint Length [m] | | |

TABLE 1-continued

| Chart Number | Title of Chart | X-Axis Title | Sub X-axis Title | Y-axis Title | Z-axis Title | X-axis Domain |
|---|---|---|---|---|---|---|
| 4 | Anomaly distribution by Surface location (Int., Ext., Mid wall, Unknown) | | | | | External Internal Mid wall Unknown |
| 5 | Overall Corrosion Metal loss distribution by Dimension class | | | | | GENE (General) PINH (Pin-hole) PITT (Pitting) AXGR (Axial Grooving) AXSL (Axial Slotting) CIGR (Circum. Grooving) CISL (Circum. Slotting) |
| 6 | Dimension Class Change over time (ILI Runs) for Internal & External metal loss | Segment No. | ILI 1 ILI 2 ILI 3 ILI 4 . . . ILI n | % | GENE (General) PINH (Pin-hole) PITT (Pitting) AXGR (Axial Grooving) AXSL (Axial Slotting) CIGR (Circum. Grooving) CISL (Circum. Slotting) | Dimension Class Change over time (ILI Runs) for Internal & External metal loss |
| 7 | Corrosion Metal loss distribution by dimension class along the pipeline route | Distance [km] | | Dimension Class | Number of anomalies/10 km | |
| 8 | Dimension Class Chart | Length/A | | Width/A | | External Internal Mid wall Unknown |
| 9 | Overall Corrosion Metal loss distribution by depth | | | | | $10 <=$ Depth, [%] $< 20$ $20 <=$ Depth, [%] $< 40$ $40 <=$ Depth, [%] $< 60$ Depth $>= 60$ |
| 10 | Corrosion Metal loss distribution by depth along the pipeline route | Distance [km] | | Anomaly Depth, % | Number of anomalies/10 km | |
| 11 | Metal loss distribution by depth and log distance | Distance [km] | | Number of anomalies/10 km | | External Internal Mid wall Unknown |
| 12 | Metal loss distribution by Anomaly Orientation | Orientation, O'clock | | Number of anomalies | | External Internal Mid wall Unknown |
| 13 | Corrosion metal loss distribution by orientation and log distance | Distance [km] | | Orientation, O'clock | | Internal Mid wall Unknown |

TABLE 1-continued

| Chart Number | Title of Chart | X-Axis Title | Sub X-axis Title | Y-axis Title | Z-axis Title | X-axis Domain |
|---|---|---|---|---|---|---|
| 14 | Corrosion metal loss distribution by orientation and log distance | Distance [km] | | Orientation, O'clock | | External |
| 15 | Corrosion metal loss distribution (Without Tolerances) by length of corrosion and log distance | Distance [km] | | Length, [mm] | | External Internal Mid wall Unknown |
| 16 | Corrosion metal loss distribution by depth of corrosion (Without Tolerances) and log distance | Distance [km] | | Depth, % of wall thickness | | External Internal Mid wall Unknown |
| 17 | Corrosion metal loss distribution by depth of corrosion (With Tolerances) and log distance | Distance [km] | | Depth, % of wall thickness | | External Internal Mid wall Unknown |
| 18 | Corrosion metal loss distribution by orientation and distance from nearest girth weld | Distance from nearest girth weld, [m] | | Orientation, O'clock | | Internal Mid wall Unknown |
| 19 | Corrosion metal loss distribution by orientation and distance from nearest girth weld | Distance from nearest girth weld, [m] | | Orientation, O'clock | | External |
| 20 | Corrosion metal loss distribution by log distance from nearest longitudinal seam | Distance, [km] | | Distance from nearest girth weld, [m] | | Internal Mid wall Unknown |
| 21 | Corrosion metal loss distribution by log distance from nearest longitudinal seam | Distance, [km] | | Distance from nearest girth weld, [m] | | External |
| 22 | Dimension Class for total number of metal losses | ILI Date | | ILI 1<br>ILI 2<br>.<br>.<br>.<br>ILI n | | GENE (General)<br>PINH (Pin-hole)<br>PITT (Pitting)<br>AXGR (Axial Grooving)<br>AXSL (Axial Slotting)<br>CIGR (Circum. Grooving)<br>CISL (Circum. Slotting) |
| 23 | User chart | To be defined by user | To be defined by user | To be defined by user | To be defined by user | To be defined by user |

Sub-Module 4-10: ILI Re-Run

According to a non-limiting embodiment, an ILI Re-Run sub-module may be implemented. If the ILI result is not acceptable (above steps for tool performance validation and results verification), the ILI dataset cannot be used, and it needs to be repeated.

Unless specified otherwise, the formulation for acceptable data loss for magnetic tools shall be: the maximum acceptable sensor loss (primary sensors) and/or data loss is 3% and continuous loss of data from more than three adjacent sensors or 25 mm circumference (whichever is smallest) is not acceptable.

Unless specified otherwise, the formulation for acceptable data loss for UT tools shall be: the maximum acceptable sensor and/or data loss is 3% and the maximum allowable signal loss due to other reasons (e.g., echo loss) is 5%, whereby continuous loss of data from more than two adjacent transducers or 25 mm circumference (whichever is smallest) is not acceptable.

For all technologies, an alternative methodology can be to define data loss based on the required POD of a specific defect like: the POD of an anomaly with minimum dimensions for a minimum percentage of the pipeline surface and pipeline length. E.g., an anomaly with L≥20 mm, W≥20 mm, d≥20% (or d≥1 mm for UT) in the pipeline shall be detected with a POD≥90% for ≥97% of the pipeline surface and ≥97% of the pipeline length.

The tool operational data statement shall indicate whether the tool has functioned according to specifications and shall detail all locations of data loss and where the measurement specifications are not met. When the specifications are not met (e.g., due to speed excursions, sensor/data loss), the number and total length of the sections shall be reported with possible changes of accuracies and certainties of the reported results.

A non-limiting embodiment will calculate below items:
Sensor loss, Percentage of continuous loss of data and number of loss sensors,
Magnetization level, Percentage of off-spec magnetization level (upper and lower than acceptable window),
Temp. gradian, to be checked with IOW (pipeline Integrity Operating Window),
Tool top position diagram, to compare this report with sensor loss plot,
Operation parameters and Battery life, to check the level of battery when pig is received in Receiver.

5) Corrosion Growth Rate (CGR) & Corrosion Initial Rate (CIR)

Figure 1E:
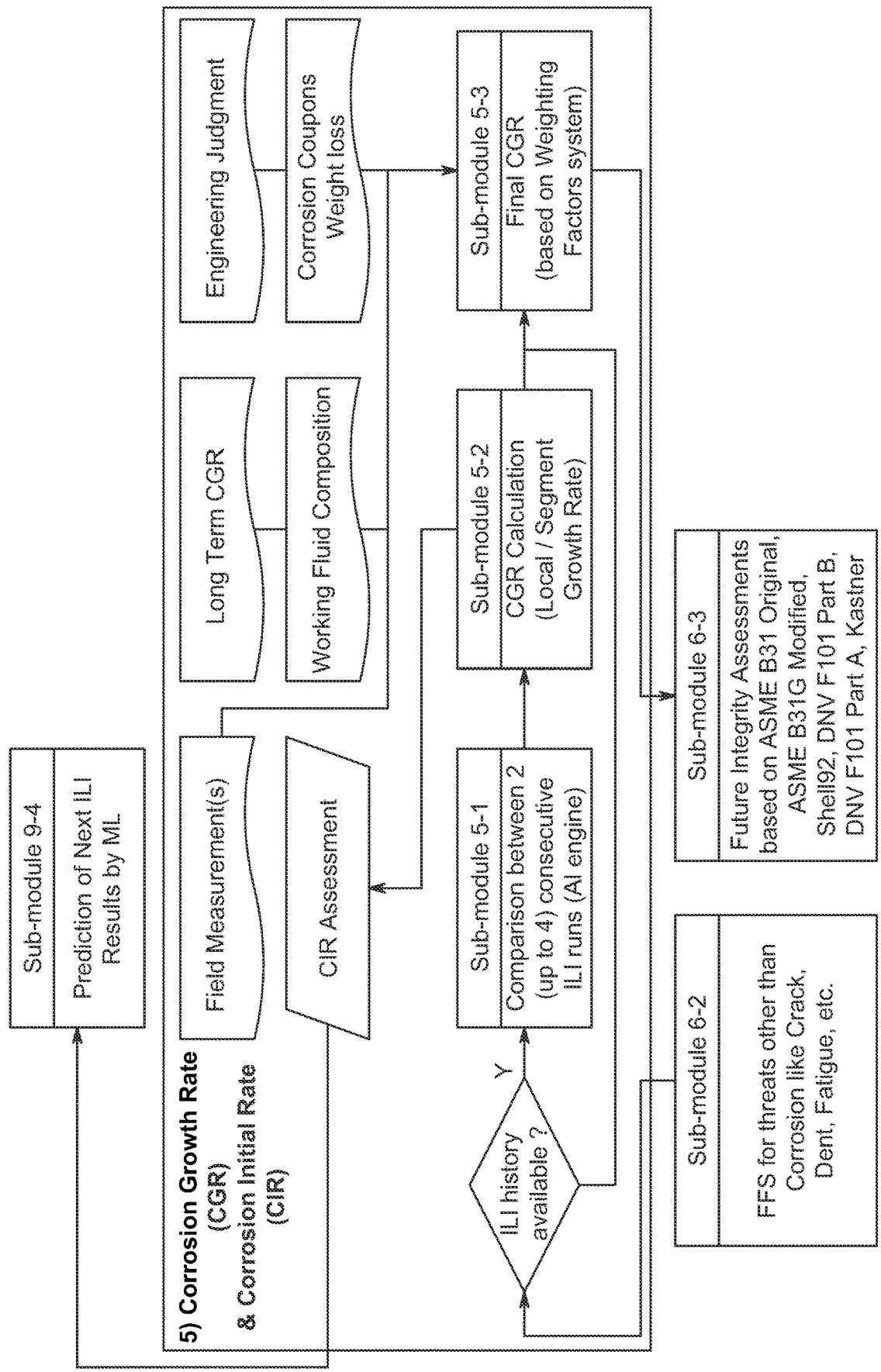

According to a non-limiting embodiment, as shown in FIG. 1E, a Corrosion Growth Rate (CGR) & Corrosion Initial Rate (CIR) module may be implemented. Various non-limiting sub-modules of the Corrosion Growth Rate (CGR) & Corrosion Initial Rate (CIR) module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

Sub-Module 5-1: Comparison Between 2 (Up to 4) Consecutive ILI Runs (Artificial Intelligence (AI) Engine)

According to a non-limiting embodiment, a Comparison Between 2 (up to 4) Consecutive ILI runs (Artificial Intelligence (AI) engine) sub-module may be implemented. All pipelines are susceptible to the possibility of corrosion damage. Corrosion is a time dependent process that leads to localized gradual thinning of the pipeline wall and, if allowed to continue, will eventually cause failure of the pipe wall.

Due to the progressive nature of corrosion, the likelihood of failure increases with time.

One means of mitigating the likelihood of such failures is to perform an in-line inspection using a metal loss detection tool. The advantage of this type of inspection is that it provides details on the size and location of metal loss features. Any features found that exceed the repair criteria will be repaired, thus reducing the likelihood of failure immediately after the inspection and repairs to a negligible level. The ILI does not, however, provide details on whether or not a feature is growing.

One way of determining if a feature is growing is to perform a comparison with the previous ILI, and an analysis of operating conditions between the two inspections, along with overlaying above ground survey inspections that have been performed between the two inspections.

The comparison of the ILIs will allow the operator to pinpoint areas of growth, new areas of corrosion, and also areas of potential third party activity. An analysis of the operating conditions will provide information on why internal metal loss features may have appeared or are growing. The above ground surveys will provide information on how long this growth has been occurring for external metal loss features.

The approach in this sub-module may compare 2 (up to 4) consecutive ILI reports by machine learning engines.

Sub-Module 5-2: CGR Calculation (Local/Segment Growth Rate)

According to a non-limiting embodiment, a CGR Calculation (Local/Segment Growth Rate) sub-module may be implemented. Pipelines are the most important energy transmission systems. Over time, pipelines can corrode. According to a non-limiting embodiment, different methods for determining corrosion of pipelines and also calculating corrosion rates will be taken into account.

Safe operation of pipelines carrying corrosive products or in a corrosive environment requires (i) an understanding of the corrosion threats, (ii) the ability to estimate corrosion growth rates (CGR) of features; and (iii) the ability to apply these rates to plan future inspections, repairs and replacements. Reducing uncertainties in corrosion behavior will therefore result in safer, more cost-efficient operation.

Models for assessing corrosion rate use single inspection and multiple inspection data. Some of the corrosion growth rate models introduced according to a non-limiting embodiment are linear model, TD-GEVD, TI-GEVD and DNV RP-F101 code model. Also, next to all industrial available methods to predict corrosion rate (internally and externally) in oil and gas pipelines, a non-limiting embodiment will have a very unique method based on Multivariable Regression Methods on ILI (In-Line Inspection) data which is very unique and the first time in this industry.

A non-limiting embodiment employs software with different inputs for internal corrosion and external corrosion data (available from inspection methods). Some are online data stream as well. At the end, the System Assessed Corrosion Rate (ACR) software will analyze all data and based on a weighting factor, it will give only one number (mm per year) for internal and one for external corrosion rate. Then pipeline integrity software based on this assessment will be able to determine the remaining lifetime of each segment of a subject pipeline.

Vision may be the biggest platform for pipeline owners/operators and inspection companies to cover:

Augmented Reality (AR) for software.

To use the benefit of big data (Artificial Intelligence) to determine corrosion rate for all territories that have sufficient data.

To provide Pipeline Integrity software based on this software (System Pipeline Suite) to determine the remaining lifetime of each segment of a subject pipeline.

Inputs are:

ILI (In-line Inspection) the last report

ILI comparison

Corrosion coupons

Multivariable Regression Method (for the first time in pipeline industry)

ER probes

Field Measurement(s) in pipeline

Working fluid composition

Etc.

Predictions of future corrosion activity support pipeline operators with critical Integrity Management (IM) decisions, such as generating repair plans, scheduling corrosion mitigation activities, defining re-inspection intervals and estimating remnant life. These predictions are made through the estimation and application of corrosion growth rates (ACR) for the features present in a pipeline.

ACR is defined as the rate of increase of corrosion depth with time. Since corrosion is governed by a complex set of electrochemical, kinetic and metallurgical processes however, this rate is rarely constant. Growth of a feature can initiate, arrest, accelerate or decelerate over time, due to changes in the local environment. Uncertainty associated with ACR measurements is therefore high and significant engineering expertise is required to make informed predictions.

This uncertainty highlights the need for inspection vendors and integrity engineers to continually advance technology, improve knowledge and build experience in corrosion growth prediction. System Pipeline ACR software provides a very innovative approach to determine ACR in pipelines.

CIR Assessment

According to a non-limiting embodiment, a Corrosion Initial Rate (CIR) Assessment sub-module may be implemented. ILI is the favoured method for determining where on a pipeline corrosion is occurring, it has also become the favoured method (when there is more than one ILI run) for estimating the corrosion growth rates based on defect population comparison and/or defect-to-defect matching. Its significant advantage over other methods is that ILI can provide size and growth rate information on the whole defect population giving visibility of what is happening along the entire pipeline. However, since ILI as a measuring technique is subject to inherent uncertainties, the prediction of corrosion rates predicted from consecutive ILI runs also has a degree of uncertainty that needs to be considered in ensuring valid and accurate corrosion rates are obtained.

Looking at a single ILI report is like looking at a photograph. It is merely a snapshot in time and does not directly reveal the evolution of time-dependent conditions. A joint-to-joint alignment provides the engineer or specialist with the element of time in the assessment. New corrosion growth, new mechanical damage, and changes in depth of existing corrosion are much more apparent when looking at the calls from each report in adjacent columns. In addition to finding conditions for remediation, a basic corrosion growth prediction can be performed by simply using the interval of time between runs and the change in wall loss. This rate can be used to predict remaining life and validate the next assessment interval. The execution of this type of assessment with basic toolset can take some serious sweat equity (time), but it can be done.

It is possible to align two or more ILI datasets in a new Excel sheet by performing a joint-to-joint match using the tool's odometer, joint lengths, wall thicknesses, and fixed features such as valves. That being said, it has been observed that some extremely large ILI reports in which a joint-to-joint comparison with basic software would be woefully inadequate.

This sub-module may be specialized in this type of work. The software can align the data and provide the joint-to-joint analysis to supplement the ILI report.

As shown in FIG. 1E, after the Corrosion Initial Rate (CIR) Assessment sub-module, the process flow may proceed to Sub-Module 9-4: Prediction of Next ILI Results by Machine Learning (ML).

Sub-Module 5-3: Final CGR (Based on Weighting Factors System)

According to a non-limiting embodiment, a Final CGR (based on Weighting Factors system) sub-module may be implemented. Accurate modelling of future corrosion growth is critical to long term pipeline integrity. A lot has been published within the industry regarding how to accurately determine corrosion growth rates (CGRs) from repeat in-line inspection data but there is limited guidance to support pipeline operators in deciding how to apply CGRs in order to support the development of repair plans and investigate pipeline remnant life. The consequences of significantly underestimating or overestimating CGRs are high and getting the balance right between the two is not straightforward.

Future integrity decisions can be made using maximum, upper bound, or average corrosion rates, and these rates may be calculated for and applied to individual features, pipe joints, or segments. All of the commonly used methods have advantages and disadvantages.

As shown in FIG. 1E, after Sub-Module 5-3: Final CGR (Based on Weighting Factors System), the process flow may then proceed to Sub-Module 6-3: Future Integrity Assessments based on ASME B31 Original, ASME B31G Modified, Shell92, DNV F101 Part B, DNV F101 Part A, Kastner.

Long Term CGR

According to a non-limiting embodiment, a Long Term CGR sub-module may be implemented. Corrosion rate may be determined based on a last ILI report.

Accurate modelling of future corrosion growth is critical to long term pipeline integrity. A lot has been published within the industry regarding how to accurately determine corrosion growth rates (CGRs) from repeat in-line inspection data but there is limited guidance to support pipeline operators in deciding how to apply CGRs in order to support the development of repair plans and investigate pipeline remnant life. The consequences of significantly under- or overestimating CGRs are high and getting the balance right between the two is not straightforward.

Future integrity decisions can be made using maximum, upper bound, or average corrosion rates, and these rates may be calculated for, and applied to, individual features, pipe joints, or segments.

Long term corrosion rate based on a last ILI (In-Line Inspection) file is one input to calculate CGR according to a non-limiting embodiment.

Field Measurement(s)

According to a non-limiting embodiment, a Field Measurement(s) sub-module may be implemented. Corrosion rate based on all field measurement and NDT results This sub module is corrosion rate-based input for all field measurement and NDT results. All field measurements (including ad hoc pipeline inspection, Dig up verification for ILI validation, Inspection before Pipeline repair, etc.)

Engineering Judgment

According to a non-limiting embodiment, an Engineering Judgment sub-module may be implemented. An engineering judgement is Subject Matter Expert (SME) knowledge for corrosion rate according to other pipelines in same field, SME previous experiences, asset owner opinion and pipeline history.

Corrosion Coupons Weight Loss

According to a non-limiting embodiment, a Corrosion Coupons Weight loss sub-module may be implemented. A corrosion coupon is an in-line intrusive corrosion monitoring device used widely in oil and gas assets. Corrosion coupons are typically constructed from carbon steel. Any corrosion coupon should be certified by recording its serial number, weight in grams, dimensions, material, and surface finish.

Corrosion coupons should be located where corrosion is expected. Corrosion coupons provide the general and pitting corrosion rates. The general corrosion rate is assessed through metal loss from the coupons over a certain time period. The worst pitting corrosion rate is assessed using the depth of the deepest pit over a period of time.

Several factors should be taken into consideration during the interpretation of corrosion coupon data, such as:
  Location,
  Exposure time,
  Corrosion product/scale composition,
  Flow velocity and flow mode, and
  Corrosion mitigation.

To ensure effective monitoring in a given system, coupons should be placed throughout the different areas in the system where the worst-case corrosion rates are predicted. This could include low points, stagnant areas, and high velocity/turbulent areas. Additionally, both the 6 o'clock and the 12 o'clock positions should be monitored for piping and pipelines.

Long exposure to the service fluid (3-6 months) is required to evaluate corrosion rates. It should be noted that some conditions such as bacteria fouling take time to develop on the coupon surface.

Corrosion coupons orientation should be consistent in order to assess and compare different data sets. Typically, a corrosion coupon should be oriented in a direction parallel to the process flow. Both of the 6 O'clock and the 12 O'clock positions should be monitored, and this is especially important for systems with multiphase/stratified flow or systems where bottom of line deposits could occur.

The corrosion coupon should be positioned in the plane of the vessel or pipe wall to provide a good representation of the flow regime of the vessel/pipe. The best representation of flow in a given system will be achieved by using flush mounted coupons rather than intrusive coupons.

Working Fluid Composition

According to a non-limiting embodiment, a Working Fluid Composition sub-module may be implemented. Corrosion rate based on fluid in the pipeline. Evaluation of corrosivity shall as a minimum include:

$CO_2$-content.
  $H_2S$-content.
  Oxygen content and content of other oxidizing agents.
  Operating temperature and pressure.
  Acidity, pH.
  Halogenide concentration.
  Velocity flow regime.

6) Integrity Assessment & FFS Calculation

Figure 1F:
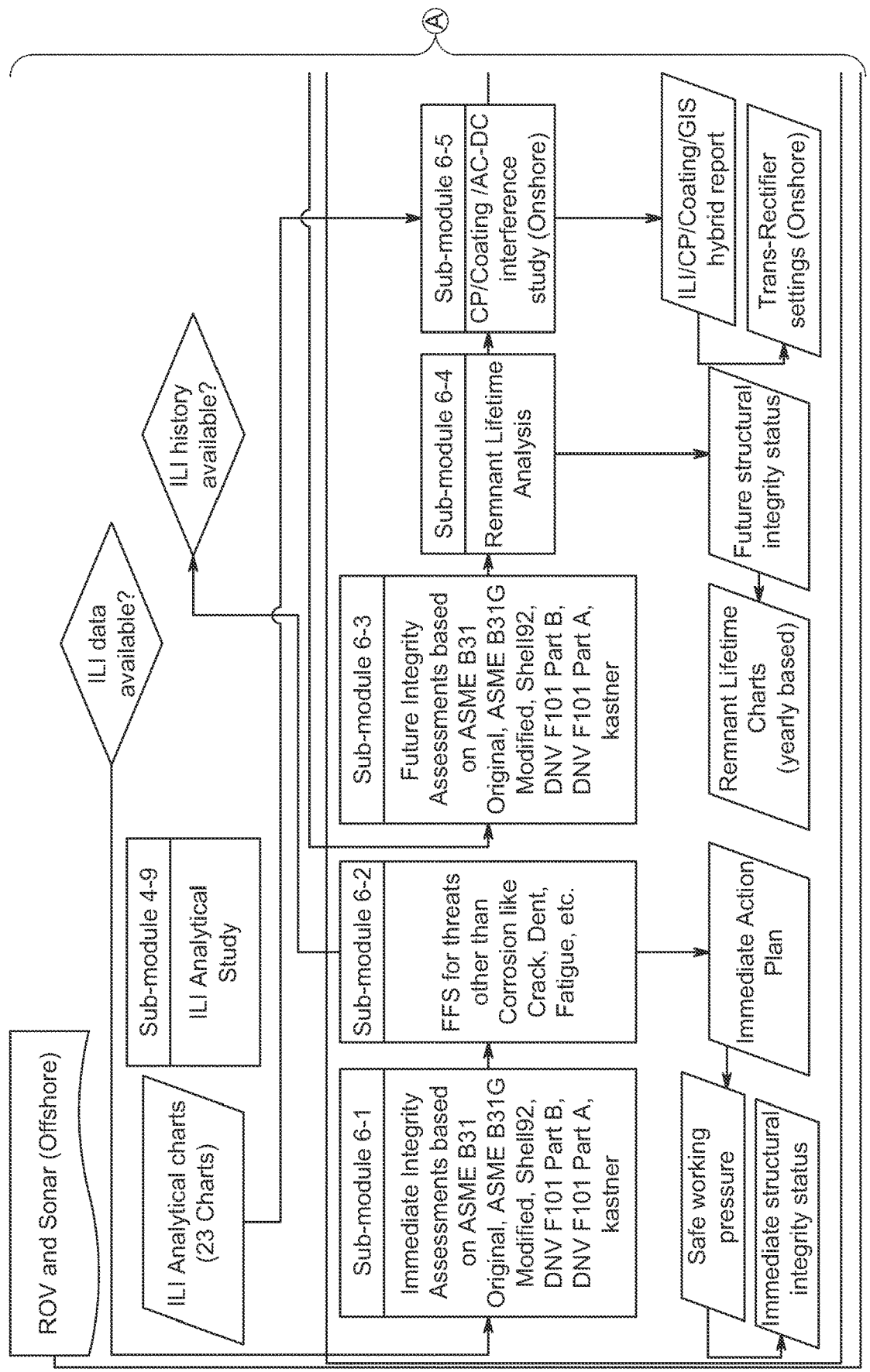
Figure 1F:
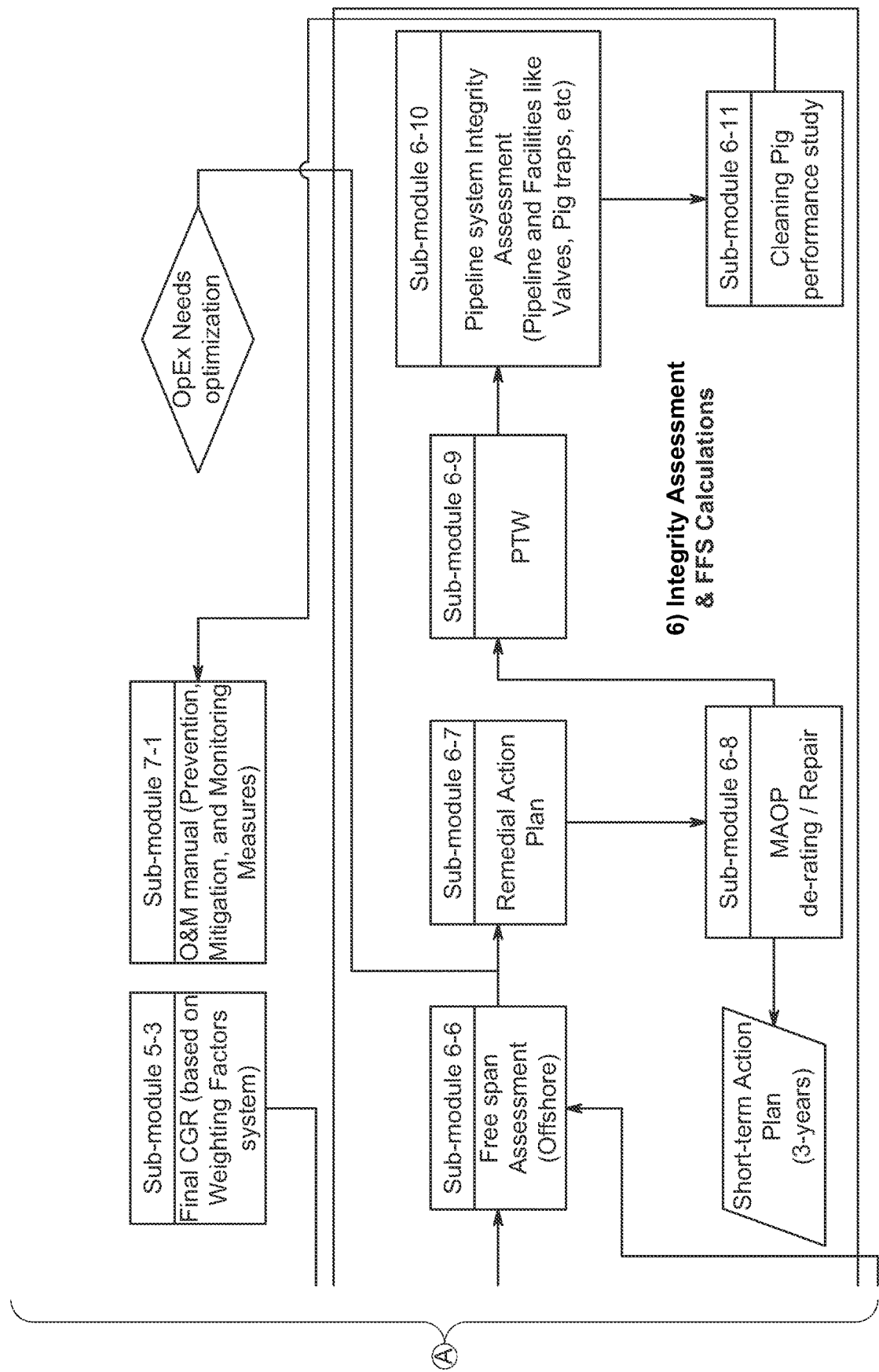

According to a non-limiting embodiment, as shown in FIG. 1F, an Integrity Assessment & FFS Calculation module may be implemented. Various non-limiting sub-modules of the Integrity Assessment & FFS Calculation module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

Sub-Module 6-1: Immediate Integrity Assessments based on ASME B31 Original, ASME B31G Modified, Shell92, DNV F101 Part B, DNV F101 Part A, Kastner According to a non-limiting embodiment, an Immediate Integrity Assessments based on ASME B31 Original, ASME B31G Modified, Shell92, DNV F101 Part B, DNV F101 Part A, Kastner sub-module may be implemented. Defects in pipelines can be introduced during manufacturing (e.g., laminations), transportation (e.g., fatigue cracking), fabrication (e.g. weld defects) and installation (e.g. dents), and can occur both due to deterioration (e.g. corrosion) and due to external interference (e.g. gouges and dents). To ensure the integrity of the pipeline, operators must be able to both detect and assess the significance of pipeline defects. Furthermore, the importance of accurate engineering models, for which the model uncertainty has been quantified, is important when applying risk-based (structural reliability) methods to pipelines.

The basic equations for assessing defects can be used to construct defect acceptance curves.

The maximum depth and length of a number of part-wall metal loss defects (square points) that have been detected in a pipeline are plotted.

Equations as per selected standard by user is used to construct two assessment curves. The first one calculates the failure stress of defects in the pipeline at the maximum operating pressure (MAOP), and the other curve shows the size of defects that would fail at the pre-service hydrotest pressure.

Sub-Module 6-2: Fitness-for-Service (FFS) for Threats Other than Corrosion Like Crack, Dent, Fatigue, Etc.

According to a non-limiting embodiment, a FFS for threats other than Corrosion like Crack, Dent, Fatigue, etc., sub-module may be implemented. Codes for design and construction of pressure vessels, pipelines, offshore structures, contain acceptance criteria that are based on workmanship standards that may be somewhat arbitrary.

During the operational phase, or in service, there may be situations where materials properties or observed defects do not meet the strict code requirements. In such cases a fitness-for-service (FFS) or engineering critical assessment (ECA) can be applied. Such an approach is nowadays becoming accepted by many codes as it is recognized that the requirements or acceptance criteria inherent in the codes may be unnecessarily conservative.

Using this alternative approach, it can be shown that the structure or component can be acceptable if the conditions for failure are not reached within its service life when subjected to many possible damage or degradation mechanisms including brittle and ductile fracture, fatigue, environmental assisted cracking and creep at higher temperatures. This step of process is for FFS action for anomalies other than metal loss corrosions.

Having decided that a defect assessment can be conducted, it is now necessary to determine the level of detail and complexity that is required.

Different levels of defect assessment, ranging from simple 'screening' methods to very sophisticated three-dimensional elastic-plastic finite element stress analyses, are available. The method used depends upon the type of defect detected, the loading conditions, the objective of the assessment, and the type and quality of data that is available.

This sub-module may be to assess all anomalies rather than metal loss corrosions.

Fitness-for-purpose, as discussed here, means that a particular structure is considered to be adequate for its purpose, provided the conditions to reach failure are not reached. Fitness-for-purpose is based on a detailed technical assessment of the significance of the defect. Local and national legislation and regulations may not permit certain types of defects to be assessed by fitness-for-purpose methods or may mandate specific limits. Such issues should always be considered prior to an assessment.

Safety must always be the prime consideration in any fitness-for-purpose assessment, and it is always necessary to appreciate the consequences of a failure. These will influence the necessary safety margin to be applied to the calculations.

As shown in FIG. 1E, after the Sub-Module 6-2: Fitness-for-Service (FFS) for threats other than Corrosion like Crack, Dent, Fatigue, etc., if ILI history is available, then the process flow may proceed to Sub-Module 5-1: Comparison Between 2 (up to 4) Consecutive ILI runs (Artificial Intelligence (AI) engine).

On the other hand, if ILI history is not available, then the process flow may proceed to Sub-Module 5-3: Final CGR (Based on Weighting Factors System).

Immediate Structural Integrity Status

According to a non-limiting embodiment, an Immediate structural integrity status sub-module may be implemented. Pipeline failures are usually related to a breakdown in a 'system', e.g., the corrosion protection 'system' has become faulty, and a combination of ageing coating, aggressive environment, and rapid corrosion growth may lead to a corrosion failure. This type of failure is not simply a 'corrosion' failure, but a 'corrosion control system' failure. Similar observations can be drawn for failures due to external interference, stress corrosion cracking, etc.

These considerations lead to the conclusion that a 'holistic' approach to pipeline defect assessment and integrity is necessary; understanding the equation that quantifies the failure load is only one aspect.

Pipeline integrity management is a general term given to all efforts (design, construction, operation, maintenance, etc.) directed towards ensuring continuing pipeline integrity. The American Petroleum Institute (API) has developed an industry consensus standard that gives guidance on developing integrity management programs (API 1160). The American Society of Mechanical Engineers (ASME) has developed a similar integrity management guidelines for a supplement to ASME B31.8.

Safe Working Pressure

According to a non-limiting embodiment, a Safe working pressure sub-module may be implemented. This sub-module may calculate and determine the safe working pressure in a pipeline with existing metal loss anomalies.

Immediate Action Plan

According to a non-limiting embodiment, an Immediate Action Plan sub-module may be implemented. This sub-module may generate an immediate action plan based on immediate integrity assessment.

Sub-Module 6-3: Future Integrity Assessments Based on ASME B31 Original, ASME B31G Modified, Shell92, DNV F101 Part B, DNV F101 Part A, Kastner According to a non-limiting embodiment, a Future Integrity Assessments based on ASME B31 Original, ASME B31G Modified, Shel192, DNV F101 Part B, DNV F101 Part A, Kastner sub-module may be implemented. This sub-module may include future integrity assessments based on internal and external corrosion rate in the pipeline.

Sub-Module 6-4: Remnant Lifetime Analysis

According to a non-limiting embodiment, a Remnant Lifetime Analysis sub-module may be implemented. This sub-module may calculate a remaining lifetime of each point of a pipeline on a map view.

Sub-Module 6-5: CP/Coating/Alternating Current (AC)-Direct Current (DC) Interference Study (Onshore)

According to a non-limiting embodiment, a CP/Coating/Alternating Current (AC)-Direct Current (DC) interference study (Onshore) sub-module may be implemented. Oil and gas pipelines are generally protected from corrosion by a barrier coating and cathodic protection (CP) system, a combination that is mandated by governmental regulations in many countries. Coatings for pipelines, such as fusion-bonded epoxy (FBE) and three-layer polyethylene (3LPE), generally provide excellent corrosion protection. In the event that the coating is damaged or degraded and the bare steel substrate is exposed, the pipeline is still protected from corrosion by CP.

According to International standards, Pipeline Coating is the most important factor for preventing corrosion-related oil and gas pipeline failures is the use of a coating with excellent barrier properties (to prevent the ingress of corroding species such as oxygen and water) and mechanical strength (to resist damage in the service environment).

During the service life of the pipeline, the coating has to maintain its integrity under operating environments and in the presence of CP. The coating also needs to be a good electrical/electrolytic insulator to isolate the metal substrate from direct contact with the electrolyte and have excellent electrical resistance to prevent any electrochemical reactions on the metal surface of the pipeline. A damaged coating that exposes bare metal areas or an aging coating that has degraded and experienced a brittle fracture renders the pipe surface susceptible to the ingress of moisture, oxygen, and other corroding species, and a functional CP system capable of meeting the current demand needed for corrosion protection will be required.

In this module, performance and integrity of Pipeline Coatings and Cathodic Protection may be assessed.

ILI/CP/Coating/GIS Hybrid Report

According to a non-limiting embodiment, an ILI/CP/Coating/GIS hybrid report sub-module may be implemented. This module may include, for example, parallelization of ILI and coating and CP results on a map.

Trans-Rectifier Settings (Onshore)

According to a non-limiting embodiment, a Trans-Rectifier settings (Onshore) sub-module may be implemented. Sustainability seems to be the latest catchphrase, and cathodic protection (CP) is an important component for the sustainability of many metal structures. Some CP systems are comprised of sacrificial anodes that naturally corrode to protect less active metals such as steel. Others require power sources to drive protective current in the right direction. The most common impressed current voltage sources are rectifiers, which can break down. Well-maintained rectifiers can provide uninterrupted CP, which reduces repair costs and labor/technician time. This sub-module discusses the fundamentals of rectifier operation and maintenance along with basic recommendations.

Sustainability is the capacity to endure. The root purpose of any cathodic protection (CP) system is to mitigate corrosion. Preserving a pipe or other metallic structure by preventing corrosion damage allows it to endure. Therefore, corrosion mitigation leads to sustainability.

CP is most commonly achieved by means of a galvanic (sacrificial) or impressed current system. A galvanic CP system is comprised of sacrificial anodes typically made of active metals (aluminum, magnesium, or zinc) that corrode in order to provide protective currents for a less active metal, such as pipeline steel. An impressed current CP (ICCP) system utilizes external power in the form of a rectifier or other voltage source that drives impressed current anodes (e.g., cast iron, graphite, and mixed metal oxide) to corrode in order to distribute protective current to the structure (cathode).

A rectifier is an electrical device that converts alternating current (AC), which periodically reverses direction, to direct current (DC), which flows in only one direction. It is imperative that a rectifier remain in a state of constant operation. Because a rectifier is an electrical device, it is vulnerable to power surges. A nearby lightning strike can cause the circuit breaker to trip or a diode to short. Therefore, routine inspections and monitoring are necessary to maintain a properly functioning, long-lasting rectifier.

Safety is the most important aspect of all inspections. The goal of any task related to rectifier operation is to perform the work safely, which includes wearing the proper protective equipment.

This sub-module may recommend the best current and voltage for each trans-rectifier in the pipeline.

Sub-Module 6-6: Free Span Assessment (Offshore)

According to a non-limiting embodiment, a Free span Assessment (Offshore) sub-module may be implemented. This sub-module may be for the design, assessment and reassessment of submarine pipeline spans in compliance with the DNV GL Recommended Practice DNVGL-RP-F105. The element enables a pipeline user to design fatigue lifetime for new free spanning pipelines due to Vortex Induced Vibrations and direct wave loading and re-assess fatigue lifetime of pipelines in operation. It supports the requirements for free spanning pipelines according to recognized design standards such as e.g., DNVGL-ST-F101, API RP 1111 and ASME B31.8.

Sub-Module 6-7: Remedial Action Plan

According to a non-limiting embodiment, a Remedial Action Plan sub-module may be implemented. Corrosion rate and the effect of anti-corrosion systems are to be evaluated by applying a monitoring program. Remedial actions are to be taken based on the evaluation results. The implications of this requirement are: (1) that if no repair is made because the anomaly has adequate remaining strength, the region will be reevaluated at a defined future time when the metal loss may be begin to encroach on the defined limits, or (2) that if a repair method is chosen that cannot contain a leak, the repair will be regarded as temporary with a permanent repair scheduled for a defined future time.

It is equally important to prevent damage to the public property which could arise for not properly repairing a defective pipe. Proper planning and implementation of remedial measures will avoid leakages and breakdowns.

Sub-Module 6-8: MAOP De-Rating/Repair

According to a non-limiting embodiment, a Maximum Allowable Operation Pressure (MAOP) de-rating/Repair sub-module may be implemented. This module may recommend the best scenario for pressure reduction or repair actions.

Short-Term Action Plan (3-Years)

According to a non-limiting embodiment, a Short-term Action Plan sub-module may be implemented. For example, a repair and monitoring detailed action plan for less than 3 years in pipeline may be implemented.

Sub-Module 6-9: Permit-to-Work (PTW)

According to a non-limiting embodiment, a Permit-to-work (PTW) sub-module may be implemented. Permit-to-work (PTW) refers to management systems used to ensure that work is done safely and efficiently. These are used in hazardous industries and involve procedures to request, review, authorize, document and most importantly, de-conflict tasks to be carried out by front line workers. Permit to work is an essential part of control of work (COW), and the integrated management of business-critical maintenance processes. Control of work is made up of permit to work, hazard identification and risk assessment (RA), and isolation management (IM), for example.

Permit to work is a core element of integrated safe system of work (ISSOW) systems, that along with risk assessment and isolation planning, enable as low as reasonably practicable (ALARP) reduction of unsafe activities in non-trivial work environments. Permit to work adherence is essential in process safety management.

Instructions or procedures are often adequate for most work activities, but some require extra care. A permit to work system is a formal system stating exactly what work is to be done, where, and when. A responsible person should assess the work and check safety at each stage. The people doing the job sign the permit to show that they understand the risks and precautions necessary.

Permits are effectively a means of communication between site management, plant supervisors and operators, and those who carry out the work. Examples of high-risk jobs where a written permit to work procedure may need to be used include hot work such as welding, vessel entry, cutting into pipes carrying hazardous substances, diving in the vicinity of intake openings, and work that requires electrical or mechanical isolation. Permits are also a means of coordinating different work activities to avoid conflicts.

A permit to work is not a replacement for robust risk assessment but can help provide context for the risk of work to be done. Studies by the UK Health and Safety Executive have shown that the most significant cause of the maintenance related accidents in the UK chemical industry was a failure to implement effective permit to work systems. Common failures in control of work systems are a failure to follow the permit to work or isolation management procedures, risk assessments that are not suitable and sufficient to identify the risks, and/or the control measures and a combination of the two.

Sub-Module 6-10: Pipeline System Integrity Assessment (Pipeline and Facilities Like Valves, Pig Traps, Etc.)

According to a non-limiting embodiment, a Pipeline System Integrity Assessment (Pipeline and Facilities like Valves, Pig traps, etc.) sub-module may be implemented.

This sub-module may include, for instance, pipeline ancillaries and equipment's integrity management.

Sub-Module 6-11: Cleaning Pig Performance Study

According to a non-limiting embodiment, a Cleaning Pig Performance Study sub-module may be implemented. In pipeline transportation, pigging is the practice of using pipeline inspection gauges, devices generally referred to as pigs or scrapers, to perform various maintenance operations. This is done without stopping the flow of the product in the pipeline.

These operations include, but are not limited to, cleaning and inspecting the pipeline. This is accomplished by inserting the pig into a "pig launcher" (or "launching station")—an oversized section in the pipeline, reducing to the normal diameter. The launching station is then closed and the pressure-driven flow of the product in the pipeline is used to push the pig along down the pipe until it reaches the receiving trap—the "pig catcher" (or "receiving station").

Pigging has been used for many years to clean large diameter pipelines in the oil and pipeline industry. Today, however, the use of smaller diameter pigging systems is now increasing in many continuous and batch process plants as plant operators search for increased efficiencies and reduced costs.

Pigging can be used for almost any section of the transfer process between, for example, blending, storage or filling systems.

Pigs are used in lube oil or paint blending to clean the pipes to avoid cross-contamination, and to empty the pipes into the product tanks (or sometimes to send a component back to its tank). Usually, pigging is done at the beginning and at the end of each batch, but sometimes it is done in the midst of a batch, such as when producing a premix that will be used as an intermediate component.

Pigs are also used in oil and gas pipelines to clean the pipes. There are also "smart pigs" used to inspect pipelines for the purpose of preventing leaks, which can be explosive and dangerous to the environment. They usually do not interrupt production, though some product can be lost when the pig is extracted. They can also be used to separate different products in a multiproduct pipeline.

Cleaning pigs are needed throughout the lifecycle of oil and gas pipelines, from pre-commissioning to operations and, ultimately, decommissioning.

A Pipeline Cleaning Pig fleet provides the highest degree of flexibility for all applications, including batching, gauging, heavy-duty cleaning, debris removal, and dewatering.

In order to guarantee the highest quality, a sub-module for Cleaning Pigs is designed in entire process.

As shown in FIG. 1F, according to a non-limiting embodiment, after Sub-Module 6-11: Cleaning Pig Performance Study, the process flow may proceed to Sub-Module 7-1: O&M manual (Prevention, Mitigation, and Monitoring Measures).

7) Prevention, Mitigation, Monitoring & Action Plans

Figure 1G:
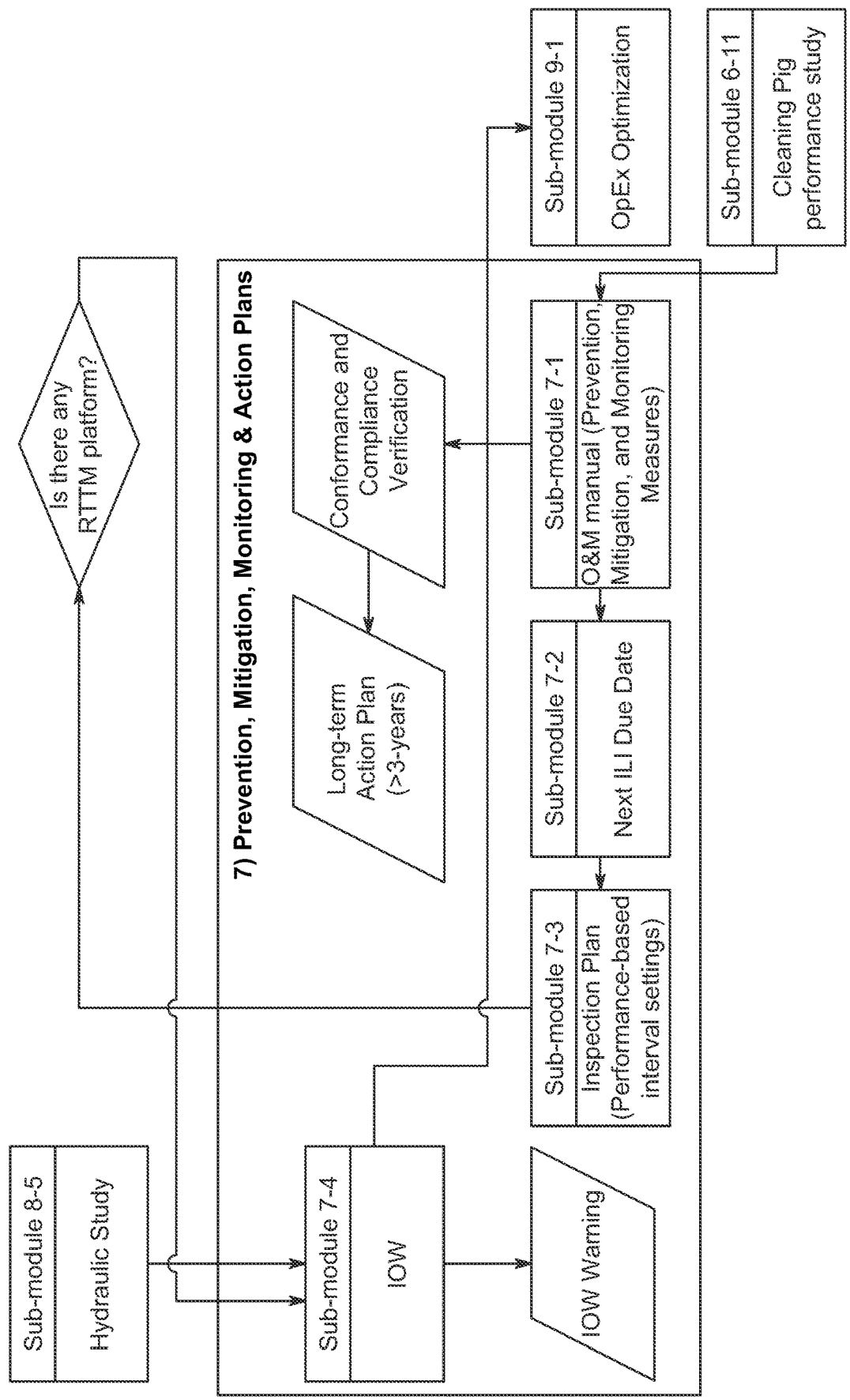

According to a non-limiting embodiment, as shown in FIG. 1G, a Prevention, Mitigation, Monitoring & Action Plans module may be implemented. Various non-limiting sub-modules of the Prevention, Mitigation, Monitoring & Action Plans module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

Sub-Module 7-1: O&M Manual (Prevention, Mitigation, and Monitoring Measures)

According to a non-limiting embodiment, an Operations and Maintenance (O&M) manual (Prevention, Mitigation, and Monitoring Measures) sub-module may be implemented. The goal of the Operations and Maintenance Activities on Pipelines Regulated Under the National Energy Board Act: Requirements and Guidance Notes (O&M Guidelines) is to provide all parties with greater clarity about how operations and maintenance (O&M) activities on pipelines (including processing plants) under the National Energy BoardAct will be regulated, while promoting safety, security, environmental protection, economic efficiency, and respect for the rights of those that may be affected.

Routine O&M activities are evaluated by this process as part of the original application for the construction and operation of a pipeline; therefore, companies are not required to apply for additional approval to undertake most O&M activities. The Board continues to regulate O&M activities and to fulfill its mandate through its inspection and audit programs.

The requirements for O&M activities contained in this process apply to all pipelines regulated under the national Act that occur on lands owned by the applicant company or where there is an agreement in place between the company and the landowner(s) that covers the construction, operation and maintenance of a pipeline, including:

company-owned land.

land rights held under easement, leased, or licensed land; and temporary workspace.

Where permanent new lands are required to carry out O&M activities companies are reminded that they must fulfill the requirements of asset owner's regulation and in-house requirements.

Conformance and Compliance Verification

According to a non-limiting embodiment, a Conformance and Compliance Verification sub-module may be implemented. Certification of pipelines has been carried out historically with a variety of scope and depth of involvement by the certifying body, but with the same end result—a certificate. The depth of involvement, or level of certification, has not always been easily detected from the certificate.

This sub-module outlines different levels of certification involvement to be selected by the owner, which will ensure that the certifier's scope is well defined. Further, by stating this level on the certificate, the recipients of the certificate also will be informed of the scope.

The purpose of the pipeline system certificate is to confirm that the pipeline, as installed and ready for use, is in a condition that complies with the technical requirements. It does not confirm that the schedule or cost of the project has been according to plan.

Strictly, the certificate covers only the as-installed condition of the pipeline and, hence, the conditions affecting this are of particular interest. However, the certification process requires that all the prior phases are verified and that temporary phases are in accordance with standard and have an acceptable risk level.

Further, the certification or verification can be a fully re-active process. This means that only the 'final steps' are verified, without regard to the consequences of e.g., detection of non-compliances or flaws late in the design or production processes. 'Final step' means the final step in which a mistake or flaw affecting the pipeline system as installed, can be detected and rectified.

A more supportive certification or verification is achieved when the verification process is pro-active. Then the certifier takes an active part in contributing to the achievement of the project schedule, budget and optimum quality. Typically, this will be achieved through an early involvement and active feedback into the project based on pipeline standard and extensive pipeline experience. Such early involvement in the design or construction processes may help to ensure that no surprises are encountered at such a late stage that it will seriously affect the cost and/or schedule of the project.

The certification or verification will, in both of the described scenarios, provide a Statement of Compliance at the completion of each of the project's stages. A Certificate of Conformity will be provided when the pipeline is ready for operation only when integrity software and process validate all mandatory steps.

Long-Term Action Plan (>3-Years)

According to a non-limiting embodiment, a Long-term Action Plan sub-module may be implemented. This sub-module may include, but is not limited to, a longer action plan for prevention, mitigation and monitoring in pipeline.

Sub-Module 7-2: Next ILI Due Date

According to a non-limiting embodiment, a Next ILI Due Date sub-module may be implemented. For example, a sub-module may be implemented to describe the next ILI due date as per pipeline performance base integrity approach.

Sub-Module 7-3: Inspection Plan (Performance-Based Interval Settings)

According to a non-limiting embodiment, an Inspection Plan (Performance-based interval settings) sub-module may be implemented. This sub-module may include, but is not limited to, a full detail inspection plan as per performance-based integrity approach.

As shown in FIG. 1G, after Sub-Module 7-3: Inspection Plan (Performance-based interval settings), if there is any RTTM platform, then the process flow may proceed to Sub-Module 8-5: Hydraulic Study.

Sub-Module 7-4: Integrity Operating Windows (IOW)

According to a non-limiting embodiment, an Integrity Operating Windows (IOWs) sub-module may be implemented. Integrity Operating Windows (IOWs) are sets of limits used to determine the different variables that could affect the integrity and reliability of a pipeline from process prospect. Put simply, IOWs are the limits under which a machine can operate safely. Working outside of IOWs may cause otherwise preventable damage or failure. For this reason, it's incredibly important to be aware of the IOWs for each machine that is in operation.

A common example of things IOWs can include is temperature or pressure limits pipelines. If the temperature is exceeded, then an operator should be given a certain amount of time to get it back under the limit.

It is important to develop limits for every possible damage mechanism that is likely to affect a component. This way the working within the limits for the machine will be able to prevent most likely types of damage that might affect it.

To start with, for every piece of equipment, an IOW plan should be created. A proper IOW plan will contain information for operators and others on how to respond to IOW alarms and variances along with how quickly they need to respond. It will need describe what process monitoring techniques and process sampling will be needed to provide assurance that the process stays within the established IOW limits.

API RP 584, Integrity Operating Windows (IOWs), is a standard by the American Petroleum Institute which covers IOWs and related topics. This standard deals with the parameters that should be established, and the data required in order to set up a proper IOW plan. It talks about the different types of IOWs used for process units. It covers risk ranking, documenting, implementing, reviewing, changing, and updating IOWs.

As shown in FIG. 1G, according to a non-limiting embodiment, after Sub-Module 7-4: Integrity Operating Windows (IOW), the process flow may proceed to Sub-Module 9-1: Operating Expenditures of a Pipeline (OpEx) Optimization.

IOW Warning

According to a non-limiting embodiment, an IOW Warning sub-module may be implemented. Integrity Operating Windows (IOWs) are sets of limits used to determine the different variables that could affect the integrity and reliability of a pipeline from process prospect. Put simply, IOWs are the limits under which a machine can operate safely. Working outside of IOWs may cause otherwise preventable damage or failure. For this reason, it is incredibly important to be aware of the IOWs for each machine that is in operation.

A common example of things IOWs can include is temperature or pressure limits for pipelines. If the temperature is exceeded, then an operator should be given a certain amount of time to get it back under the limit.

It is important to develop limits for every possible damage mechanism that is likely to affect a component. This way, working within the limits for the machine will be able to prevent the most likely types of damage that might affect it.

To start with, for every piece of equipment, an IOW plan should be created. A proper IOW plan will contain information for operators and others on how to respond to IOW alarms and variances along with how quickly they need to respond. It will need describe what process monitoring techniques and process sampling will be needed to provide assurance that the process stays within the established IOW limits.

API RP 584, Integrity Operating Windows (IOWs), is a standard by the American Petroleum Institute which covers IOWs and related topics. This standard deals with the parameters that should be established, and the data required in order to set up a proper IOW plan. It talks about the different types of IOWs used for process units. It covers risk ranking, documenting, implementing, reviewing, changing, and updating IOWs.

8) RTTM Based Integrity Assessment

Figure 1H:
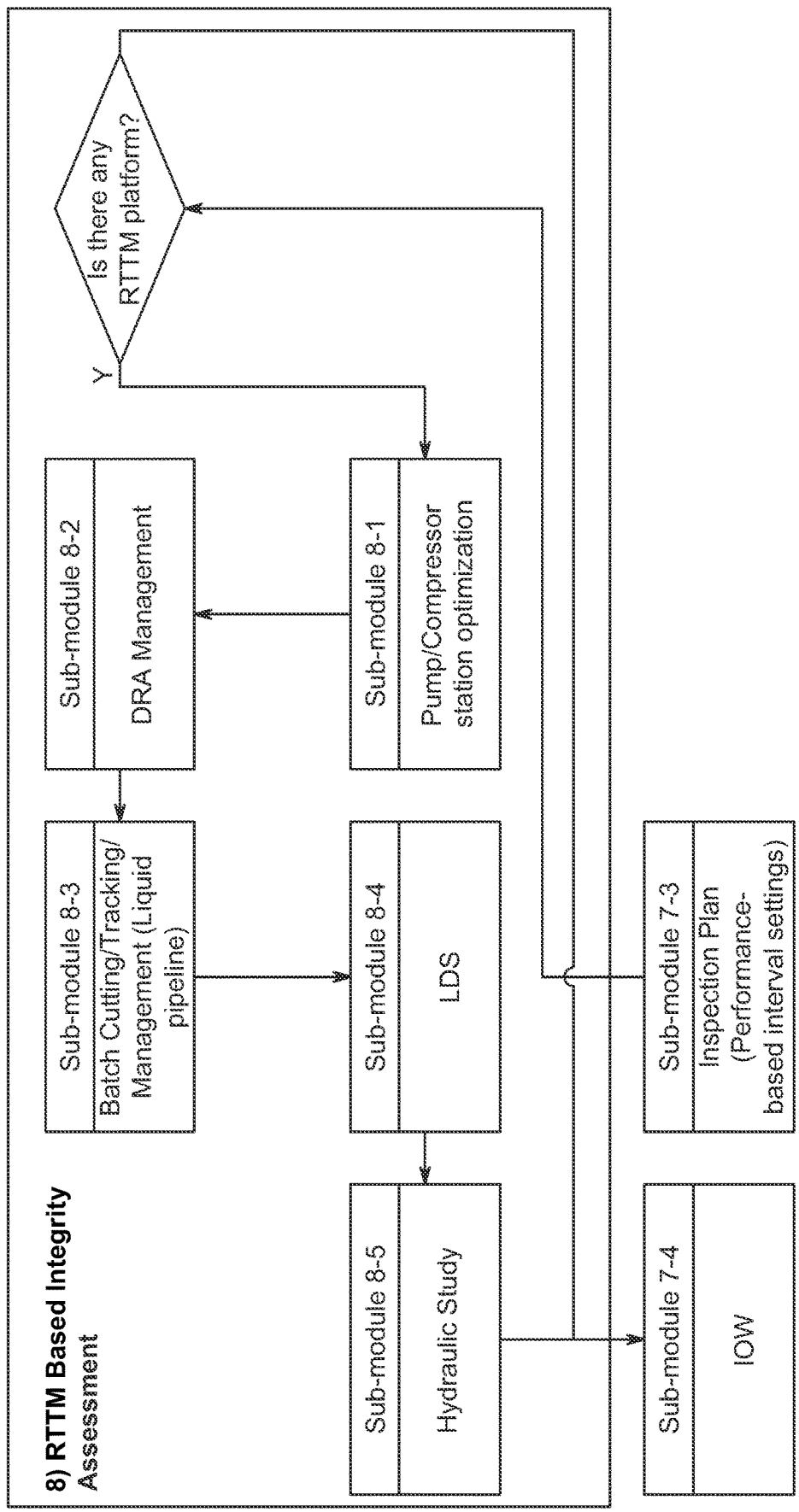

According to a non-limiting embodiment, as shown in FIG. 1H, a Real Time Transient Model (RTTM) Based Integrity Assessment module may be implemented. Various non-limiting sub-modules of the RTTM Based Integrity Assessment module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

Sub-Module 8-1: Pump/Compressor Station Optimization

According to a non-limiting embodiment, if there is any RTTM platform, then a Pump/Compressor Station Optimization sub-module may be implemented. To optimize pump/compressor stations and their efficiency. The Pump application helps to monitor the performance capabilities of pumps because energy consumption is the single largest operating expense for many pipelines.

Pump characteristic curves are used to represent pump performance in regard to:
  Pumping head and volume flow rate
  Efficiency and volume flow rate
The application allows the selection of:
  One pump
  All pumps of a station
  All pumps of a pipeline segment
In addition to pump curves and actual operating points, the following data may be provided:
  Volume flow
  Pumping head
    Power consumption
    Revolution speed
    Liquid density
    Volume flow at optimal operating point
    Pumping head at optimal operating point
    Efficiency at optimal operating point
    Pump model The Pump Management application is used to manage pump models and to assign the corresponding model data to pumps. A pump model is a complete data set of hydraulic and energy properties of a pump unit.

According to a non-limiting embodiment, operators can edit and modify all master data.

Sub-Module 8-2: DRA Management

According to a non-limiting embodiment, a Drag Reduction Agent (DRA) Management sub-module may be implemented. This sub-module may, for instance, determine the dosage, location and interval of DRA injection. This sub-module may reduce energy consumption, increase pipeline flow and determine the effectiveness of these additives.

Sub-Module 8-3: Batch Cutting/Tracking/Management (Liquid Pipeline)

According to a non-limiting embodiment, a Batch Cutting/Tracking/Management (Liquid pipeline) sub-module may be implemented. This sub-module may, for instance, manage different batches in crude oil pipelines. This sub-module may, for instance, track volume, location and movement of hundreds of different products, from injection to intermediate and final delivery points. This sub-module may, for instance, monitor each interface mixing. This sub-module may, for instance, adjust user schedules to changed conditions.

Sub-Module 8-4: Leak Detection System (LDS)

According to a non-limiting embodiment, a Leak Detection System (LDS) sub-module may be implemented. This sub-module may, for instance, use pipeline leak detection to determine if and, in some cases, where a leak has occurred in systems which contain liquids and gases. Methods of detection include hydrostatic testing, infrared, and laser technology after pipeline erection and leak detection during service.

Pipeline networks are a mode of transportation for oil, gases and other fluid products. As a means of long-distance transport, pipelines have to fulfill high demands of safety, reliability and efficiency. If properly maintained, pipelines can last indefinitely without leaks. Some significant leaks that do occur are caused by damage from nearby excavation, but most leaks are caused by corrosion and equipment failure and incorrect operation. If a pipeline is not properly maintained, it can corrode, particularly at construction joints, low points where moisture collects, or locations with imperfections in the pipe. Other reasons for leaks include exterior force damage (such as damage by cars and drilling rigs) and natural force (such as earth movement, heavy rain and flooding, lightening, and temperature).

The most common leak detection method for pipeline operators is called the Supervisory Control and Data Acquisition (SCADA) system. This system uses a series of sensors to track data such as pressure, flow rates, temperature, and whether valves are open or closed. The sensors relay the information to a control room where operators determine the legitimacy of the leak alarms. Some systems have added the Computational Pipeline Monitoring System (CPM), whose main task is to detect leaks. These systems have been reported by pipeline operators to the Pipeline operators and Hazardous Materials Safety Administration to be inefficient in leak detection.

The primary purpose of leak detection systems (LDS) is to help pipeline controllers to detect and localize leaks. LDS provide alarms and displays other related data to the pipeline controllers to assist decision-making. Pipeline leak detection systems can also enhance productivity and system reliability thanks to reduced downtime and inspection time.

According to the API document "RP 1130", LDS's are divided into internally based LDS's and externally based LDS's. Internally based systems use field instrumentation (for example flow, pressure or fluid temperature sensors) to monitor internal pipeline parameters. Externally based systems use a different set of field instrumentation (for example infrared radiometers or thermal cameras, vapor sensors, acoustic microphones or fiber-optic cables) to monitor external pipeline parameters.

Sub-Module 8-5: Hydraulic Study

According to a non-limiting embodiment, a Hydraulic Study sub-module may be implemented. The Real-Time Transient Modelling (RTTM) application is a tool that provides reliable and comprehensive information about the actual but invisible physical processes inside a pipeline. The results are used by operators to:
  Have information in unmetered areas,
  Identify changing conditions,
  Make correct decisions, and
  Observe the consequences of initiated actions.
The results are used by other applications to:
  Calculate very precise mass balances,
  Avoid leak detection and location errors,
  Determine exact tracking positions and arrival times,
  Advise on energy consumption,
  Advise on segments affected by corrosion, and
  Identify malfunctioning instrumentation.

According to a non-limiting embodiment, after Sub-module Module 8-5: Hydraulic Study, the process flow may proceed to Sub-module Module 7-4: Integrity Operating Windows (IOW).

9) Management Review, Integrity Performance & KPI

Figure 1I:
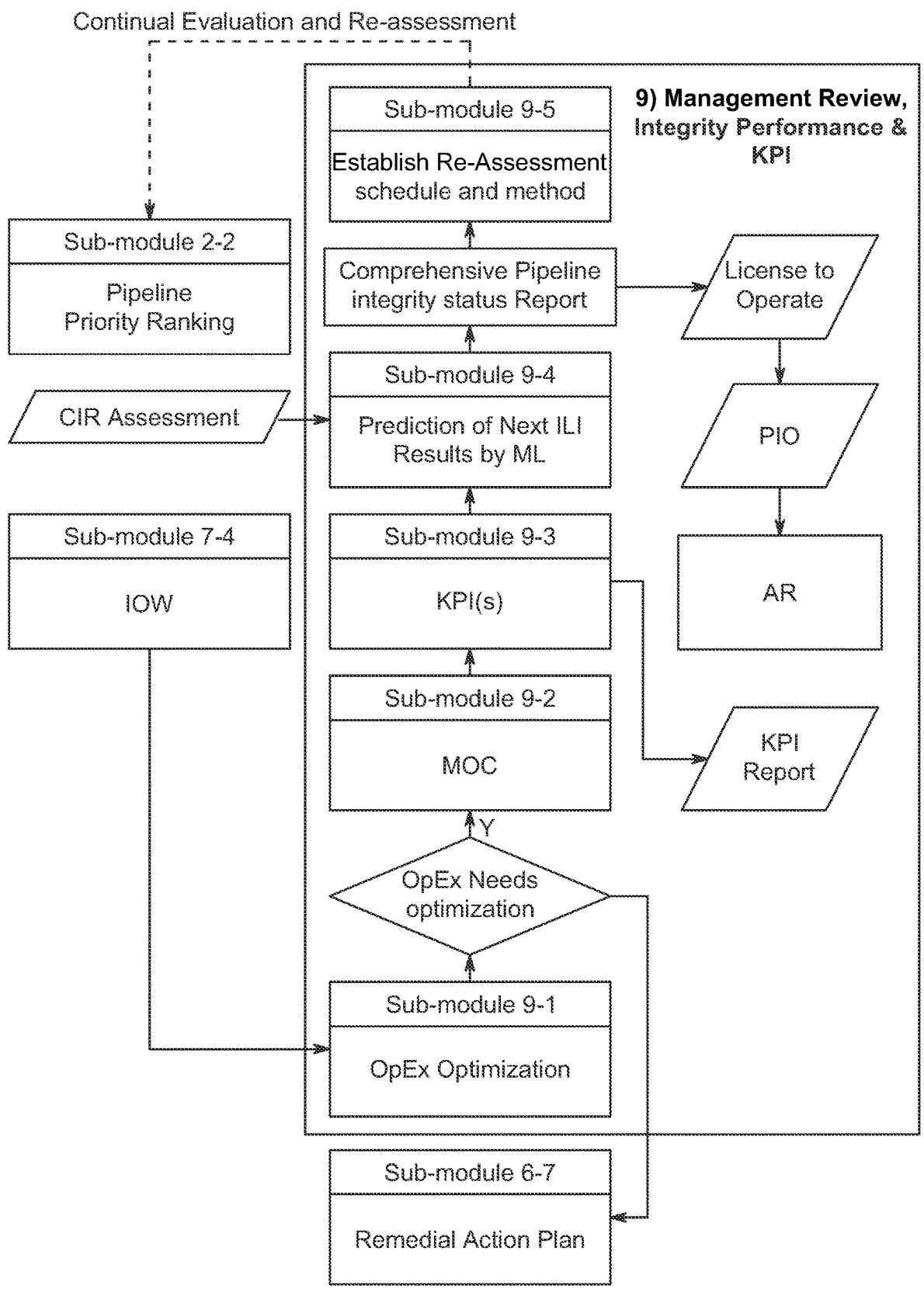
Figure 1J:
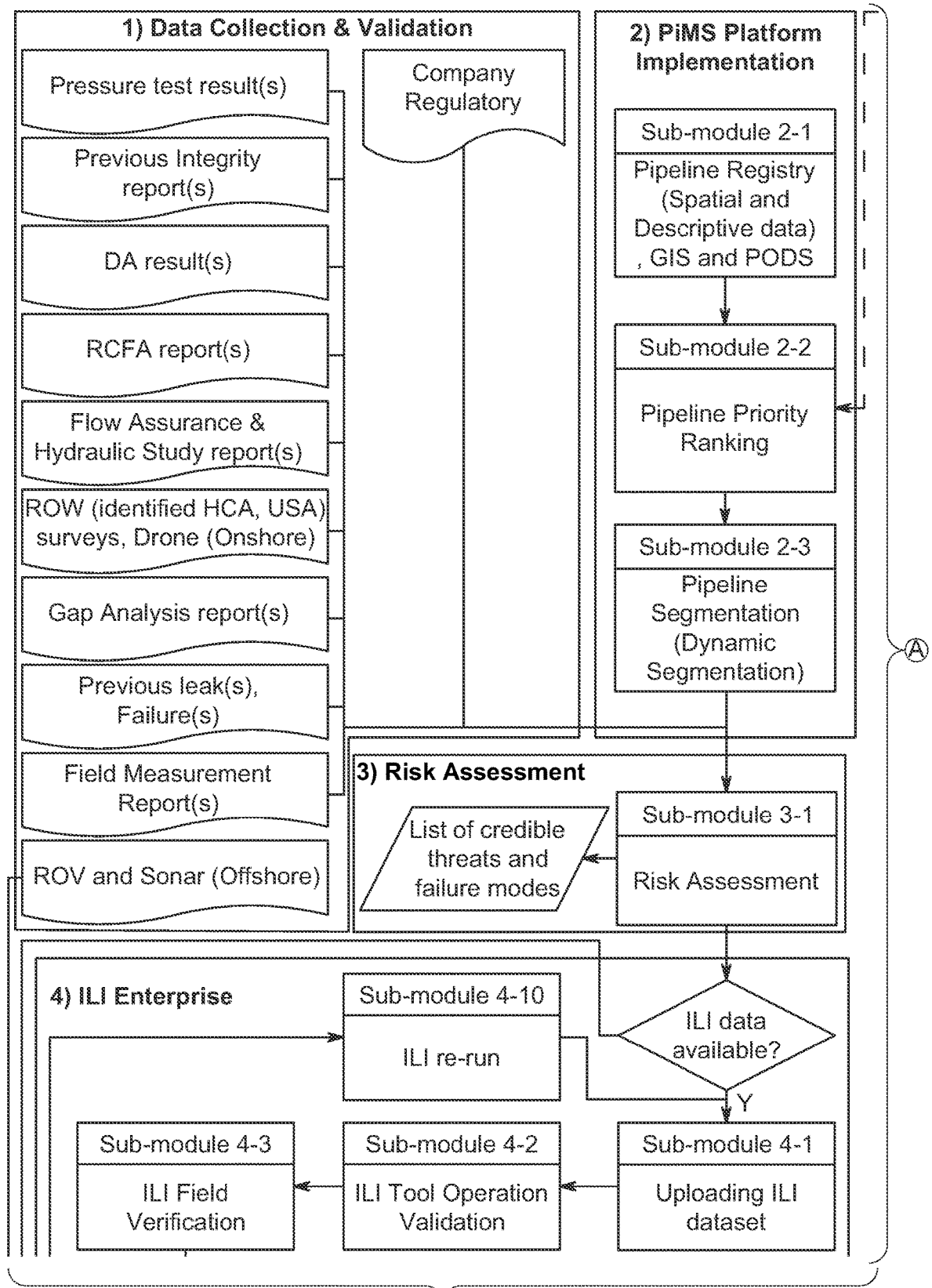
Figure 1J:
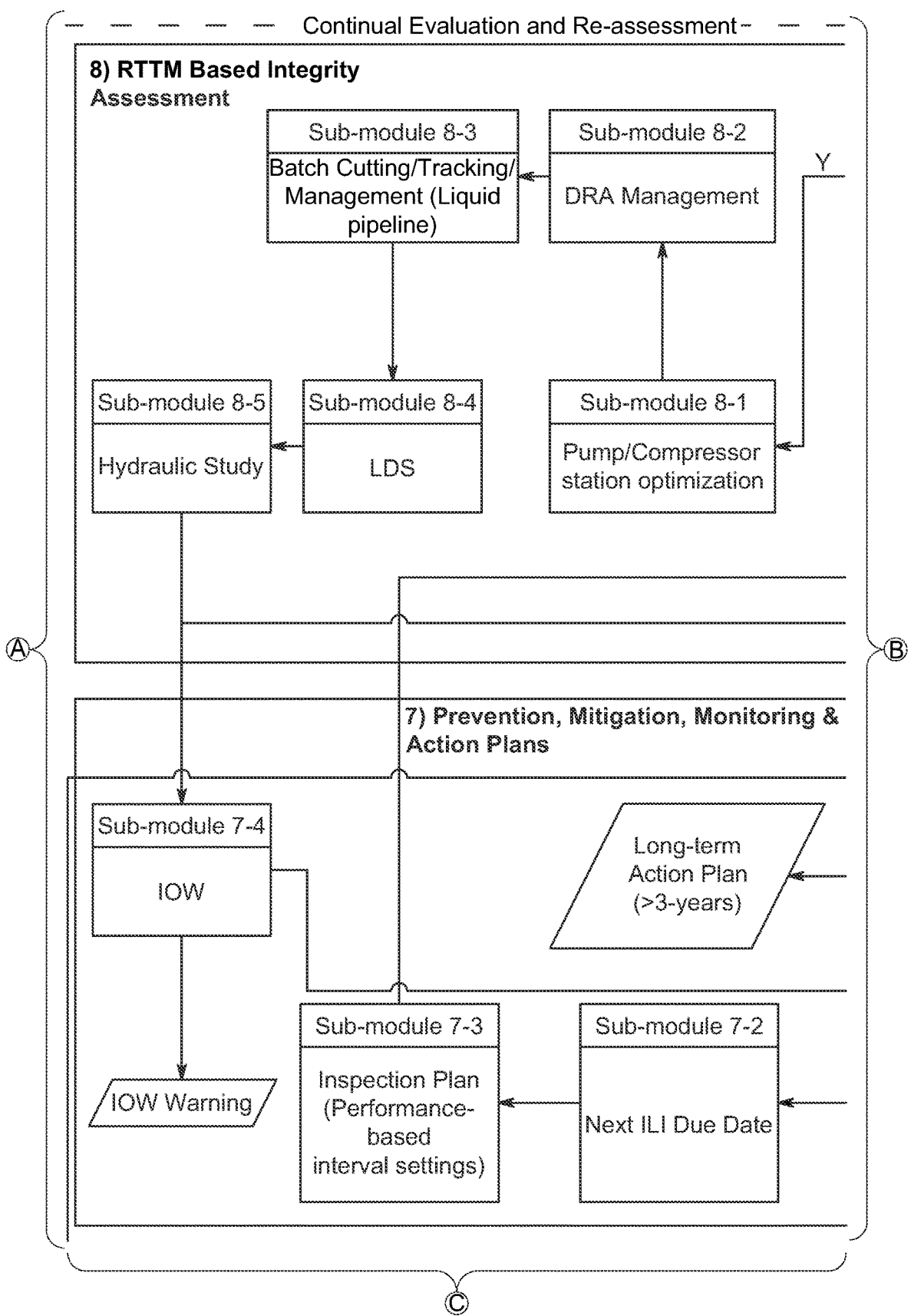
Figure 1J:
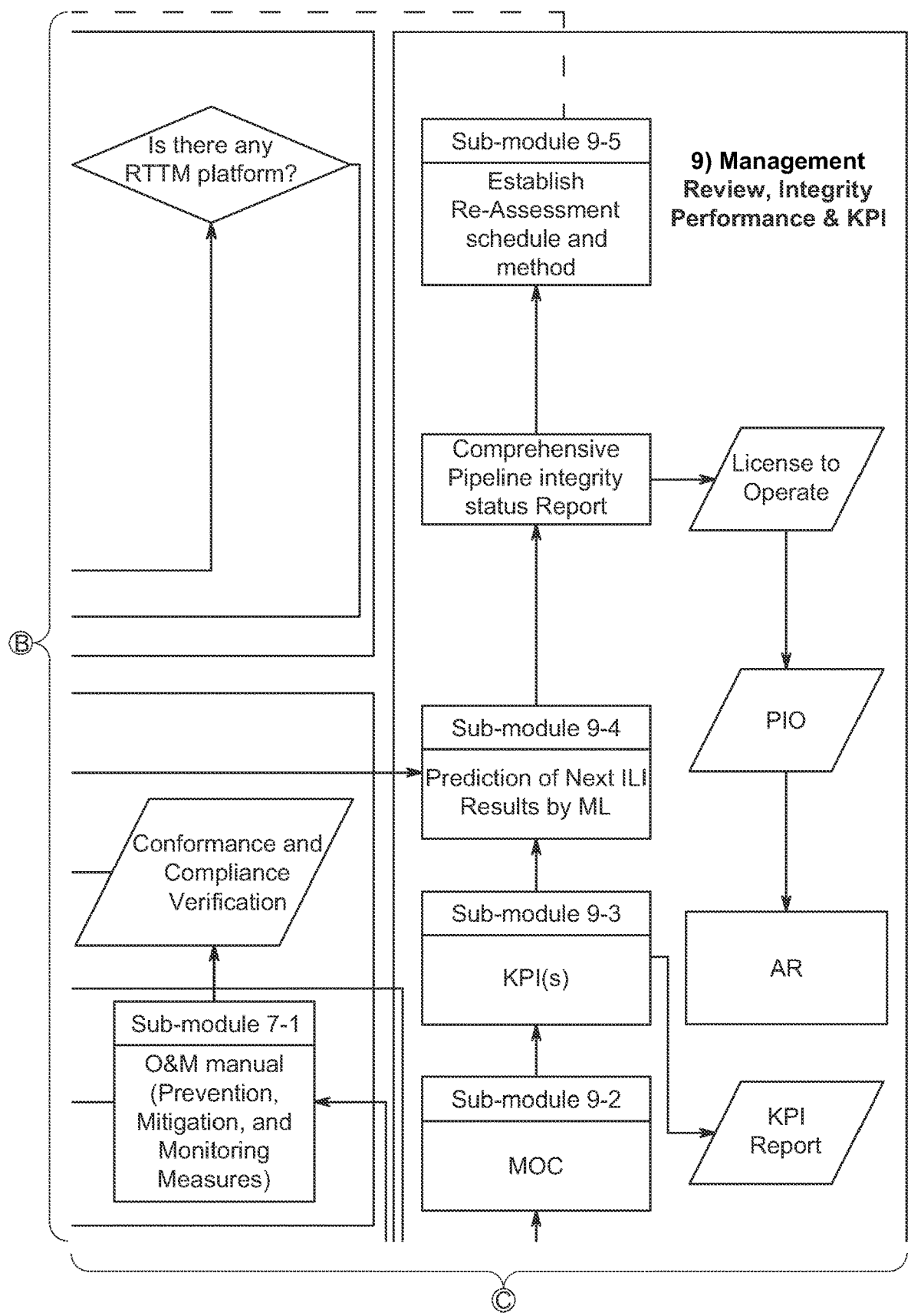
Figure 1J:
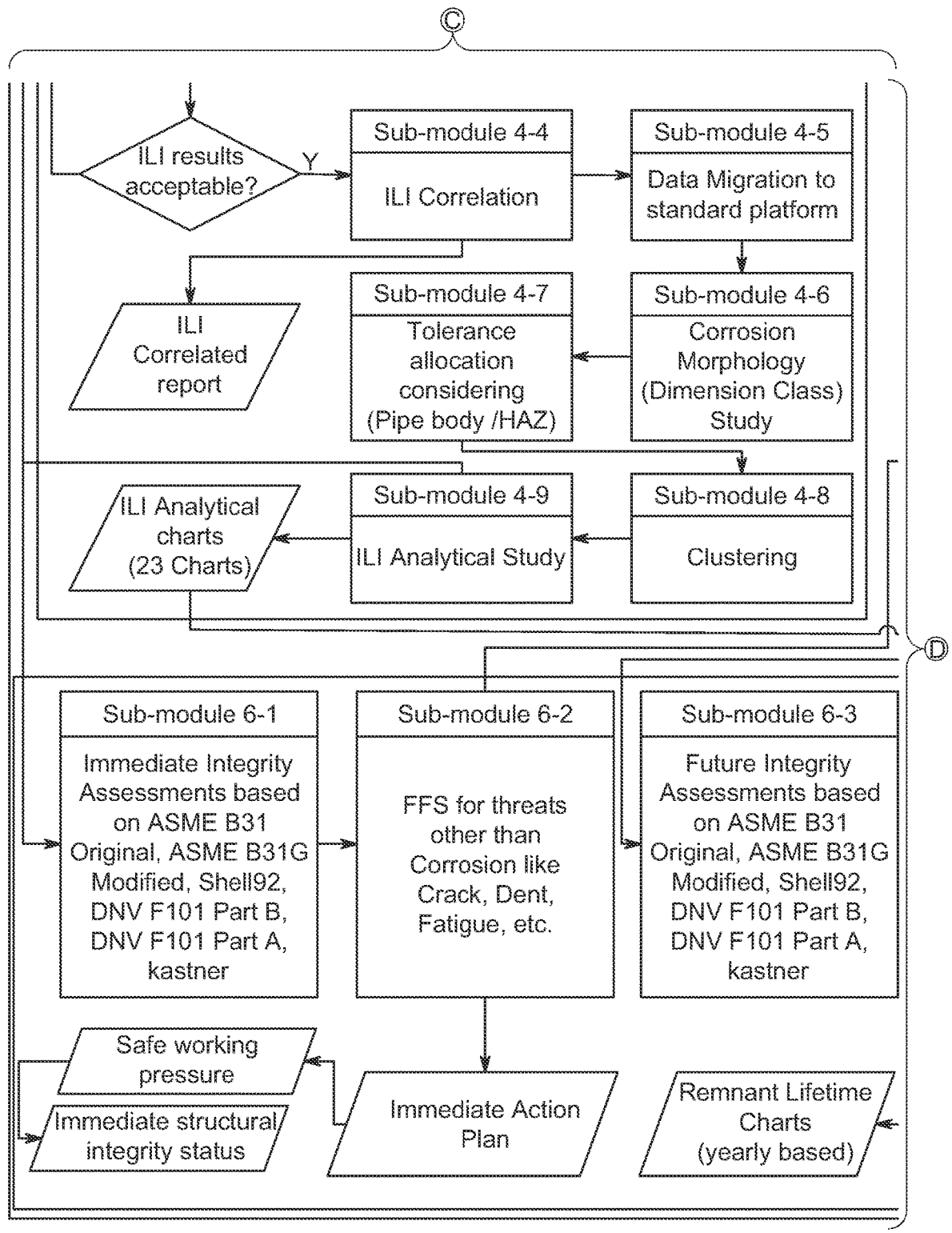
Figure 1J:
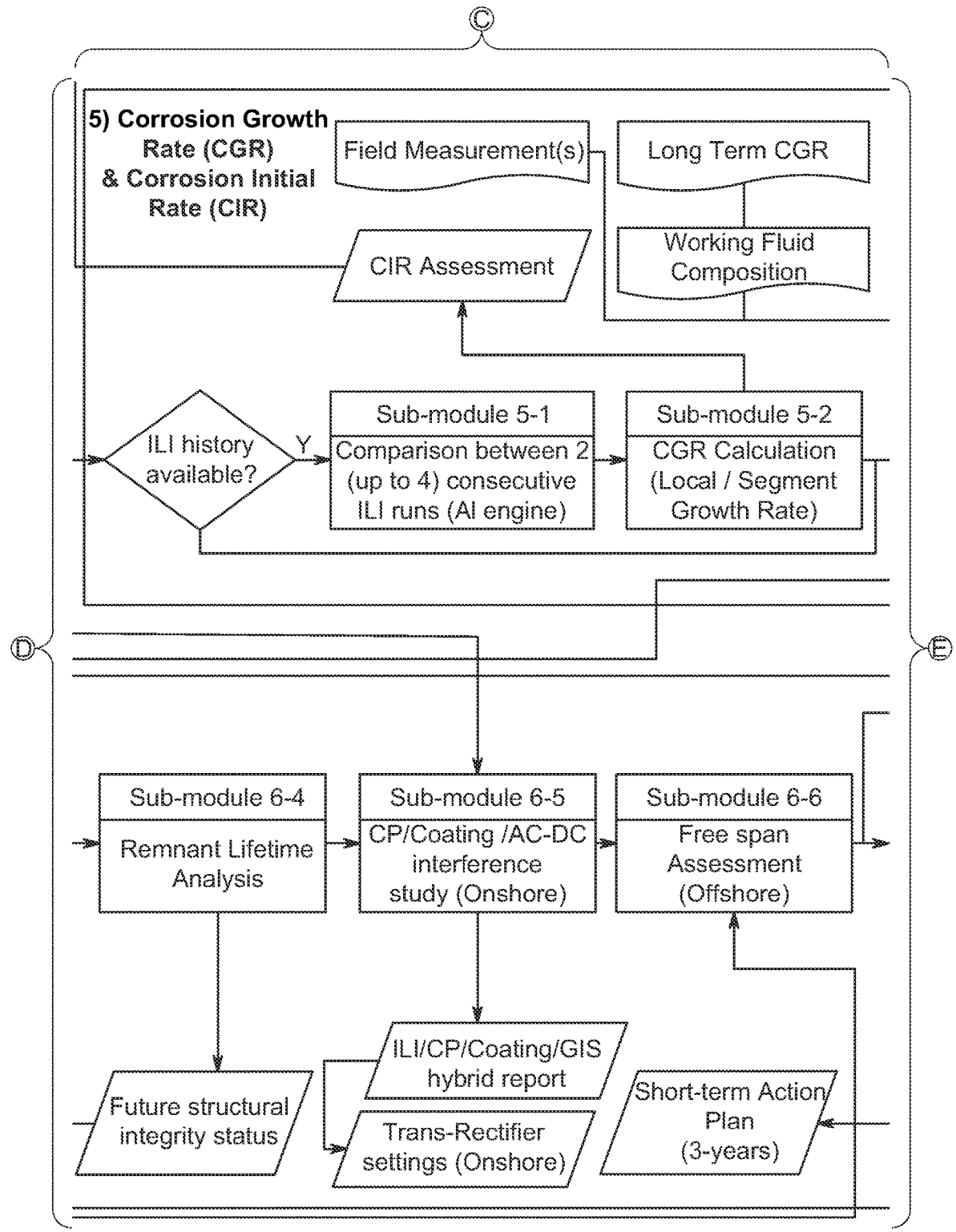
Figure 1J:
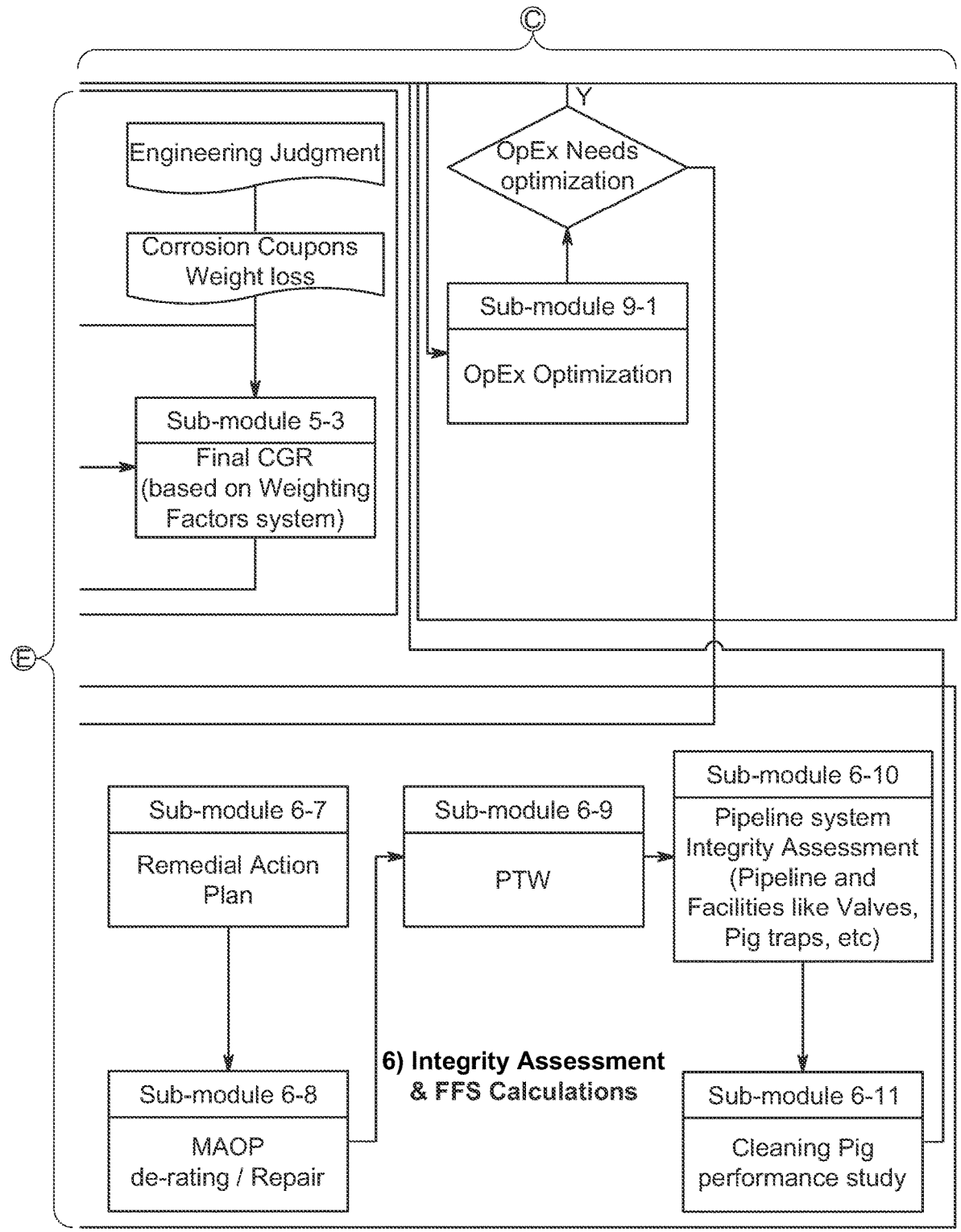

According to a non-limiting embodiment, as shown in FIG. 1I, a Management Review, Integrity Performance & Key Performance Indicator (KPI) module may be implemented. Various non-limiting sub-modules of the Management Review, Integrity Performance & KPI module are discussed in turn below.

Although the sub-modules are described in a specific order below, according to various non-limiting embodiments, sub-modules may be implemented in different orders, sub-modules may be implemented at the same time or at different times, sub-module(s) may be implemented while other sub-module(s) may not be implemented, and sub-module(s) may be included or omitted, as appropriate.

Sub-Module 9-1: Operating Expenditures of a Pipeline (OpEx) Optimization

According to a non-limiting embodiment, an OpEx Optimization sub-module may be implemented. The increasing number of corrosion-based incidents in pipeline systems within recent decades has encouraged decision makers to focus on predicting when pipelines will fail, and to improve maintenance strategies. Policymakers and pipeline operators need to frequently evaluate and renew existing failure prediction models and maintenance strategies. Accordingly, this sub-module accomplishes the following two objectives: (1) it developed a predictive failure model for internal and external pipeline corrosions, and (2) it developed a model to determine the optimal timeline for maintenance policy, when the corresponding costs can be minimized. To find the optimal replacement time, a cost-effective model is developed to determine the latest time that maintenance can be scheduled before the cost of the maintenance increases. The results of this study will help decision makers in the pipeline industry accurately predict the number of failures in pipeline networks, and wisely select the most appropriate maintenance policies.

Sub-Module 9-2: MOC

According to a non-limiting embodiment, a Management of Change (MOC) sub-module may be implemented. The MOC process shall be applied in accordance with this procedure for all personnel & organization changes that affect HSE or regulatory compliance, physical, operational, chemical and process changes made at any pipeline asset and/or work location owned by pipeline owner.

The MOC procedure is applicable throughout the lifecycle of assets. This includes all phases of an asset lifecycle from the project design, commissioning, operation, and abandonment.

The major steps of the MOC system are:
Initiate MOC,
Classify type of change,
Evaluate Review stage,
Approve change,
Implement change, and
Close documentation.

Sub-Module 9-3: Key Performance Indicator (KPI)

According to a non-limiting embodiment, a Key Performance Indicator (KPI) sub-module may be implemented. Corrosion is a major threat that affects many assets of the oil and gas industry. Therefore, it is important to develop and implement good corrosion control strategies. The key performance indicators (KPIs) provide operators an effective tool to track implementation and success of the corrosion control strategies.

Few practical and measurable KPIs have been identified to track implementation of corrosion control strategies. This sub-module evaluates the applicability of these KPIs for tracking the implementation of corrosion control strategies in a gas transmission pipeline.

Sub-Module 9-4: Prediction of Next ILI Results by Machine Learning (ML)

According to a non-limiting embodiment, a Prediction of Next ILI Results by Machine Learning (ML) sub-module may be implemented. This sub-module may, for instance, predict a next ILI result by using Artificial Intelligence (AI) engines.

Corrosion Initial Rate (CIR) Assessment

According to a non-limiting embodiment, a CIR Assessment sub-module may be implemented. According to this sub-module, a corrosion initial rate assessment through ML in ILI comparison algorithm may be developed.

Comprehensive Pipeline Integrity Status Report

According to a non-limiting embodiment, a Comprehensive Pipeline Integrity Status Report sub-module may be implemented. This sub-module may include, for instance, full integrity status of a pipeline system.

License to Operate

According to a non-limiting embodiment, a License to Operate sub-module may be implemented. This sub-module may include, for instance, a license to confirm that a subject pipeline system is fit for service until the next integrity study loop. A pipeline asset owner will require an onshore/offshore pipeline license if they intend to operate a pipeline for the conveyance of petroleum or a gas substance. The license provides the legal title to remove petroleum or greenhouse gasses from an area using a pipeline constructed according to the specifications on the license. A license defines the need to obtain recognition/certification and registration to undertake a certain business activity to continue operation of an Oil and Gas pipeline.

Pipeline Integrity Outlook (PIO)

According to a non-limiting embodiment, a Pipeline Integrity Outlook (PIO) sub-module may be implemented. This sub-module may include, for instance, a very comprehensive pipeline integrity outlook to give an idea of risk segments of a pipeline in a glance.

Augmented Reality (AR)

According to a non-limiting embodiment, an Augmented Reality (AR) sub-module may be implemented. A pipeline network is the most efficient and economical means of transporting hydrocarbons. The pipeline operator's objective is to operate and maintain pipeline network in such a way that it would continuously provide uninterrupted services to customers. Locating underground pipes and other infrastructure prior to excavation or repair has long been a problem. While tremendous development has taken place in the field of locating technologies over the past decades, no one method has emerged as being complete. Errors in locating excavations for new installation or for repair of existing utilities can result in significant costs, loss of life and damage to property. There is thus a clear need for new solutions to accurately located pipeline infrastructure and improve excavation safety. This sub-module describes combination of Geospatial database of pipeline along with augmented reality to design a new visual system.

Sub-Module 9-5: Establish Re-Assessment Schedule and Method

According to a non-limiting embodiment, an Establish Re-Assessment Schedule and Method sub-module may be implemented. As shown in FIG. 1I, after Sub-Module 9-5: Establish Re-Assessment Schedule and Method, the process flow may proceed to Sub-Module 2-2: Pipeline Priority Ranking.

Existing methods for determining the optimal inspection interval mainly used a constant fixed re-assessment interval as the decision variable during the whole service. However, pipelines with different defect sizes at the current inspection point lead to different future defect growth and failure probability, and it is more reasonable to apply different re-assessment intervals depending on pipeline health conditions. A non-limiting embodiment provides a solution to shift from a prescriptive pipeline integrity approach to performance based integrity approach. A non-limiting embodiment will end up with huge savings in pipeline OpEx (Operation Expenses)

The foregoing disclosure provides illustration and description, but is not intended to be exhaustive or to limit the implementations to the precise form disclosed. Modifications and variations are possible in light of the above disclosure or may be acquired from practice of the implementations.

Some embodiments may relate to a system, a method, and/or a computer readable medium at any possible technical detail level of integration. Further, one or more of the above components described above may be implemented as instructions stored on a computer readable medium and executable by at least one processor (and/or may include at least one processor). The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

Embodiments of the disclosure have been shown and described above, however, the embodiments of the disclosure are not limited to the aforementioned specific embodiments. It may be understood that various modifications, substitutions, and improvements can be made by those having ordinary skill in the art in the technical field to which the disclosure belongs, without departing from the spirit of the disclosure as claimed by the appended claims. It should be understood that such modifications, substitutions, and improvements shall fall within the protection scope of the disclosure, and should not to be construed independently from the technical idea or prospect of the disclosure.

What is claimed is:

1. A system comprising:
a display;
a memory storing instructions;
a processor operably connected with the display and the memory, configured to execute the stored instructions to provide an integrated pipeline data interface by implementing:
   a data collection module operably connected to Magnetic Flux Leakage (MFL) tools, Ultrasonic Pigs, Pressure and Temperature Sensors, Corrosion Coupons, Electrical Resistance (ER) Probes, or a combination thereof, configured to collect and store pipeline integrity data in a central database;
   a PIMS Platform module;
   a risk assessment module;
   an in-line inspection enterprise module;
   a corrosion growth rate and corrosion initial rate module configured to determine internal and external corrosion rates by comparing two or more consecutive In-Line Inspection reports using artificial intelligence;
   an integrity assessment and fitness-for-service module;
   a prevention, mitigation, monitoring and action plan module;
   a real-time transient model-based integrity assessment module;
   a management review, integrity performance and key performance indicator module;
   a sophisticated mapping platform configured to process pipeline integrity status and determine a remaining lifetime of each point of a pipeline based on maximum allowable operating pressure calculations;
wherein the processor is configured to control the display to display the integrated pipeline data on an augmented Reality platform, allowing a user to interact with 3D representations of pipeline integrity data and assessment results.

2. The system according to claim 1, wherein the data collection module comprises:
collecting and storing pressure test result data;
collecting and storing previous integrity report data;
collecting and storing direct assessment result data;
collecting and storing root causes failure analysis report data;
collecting and storing flow assurance and hydraulic study report data;
collecting and storing right of way data, identified high consequences area data, and unusual sensitive area survey data;
collecting and storing gap analysis report data;
collecting and storing previous leak and failure data;
collecting and storing field measurement report data; and
collecting and storing company regulatory data.

3. The system according to claim 1, wherein the PIMS Platform module comprises:
a pipeline registry sub-module, which uses Geographic Information System data and Pipeline Open Data Standard data;
a pipeline priority ranking sub-module; and
a pipeline segmentation sub-module.

4. The system according to claim 1, wherein the risk assessment module comprises:
a list of credible threats and failure modes sub-module.

5. The system according to claim 1, wherein the in-line inspection enterprise module comprises:
an uploading in-line inspection dataset sub-module;
an in-line inspection tool operation validation sub-module;
an in-line inspection field verification sub-module;
an in-line inspection correlation sub-module;
a data migration to standard platform sub-module;
a corrosion morphology study sub-module;
a tolerance allocation sub-module;
a clustering sub-module;
an in-line inspection analytical study sub-module; and
an in-line inspection re-run sub-module.

6. The system according to claim 1, wherein the corrosion growth rate and corrosion initial rate module comprises:
a comparison between at least two consecutive in-line inspection runs sub-module.

7. The system according to claim 1, wherein the integrity assessment and fitness-for-service module comprises:
an immediate integrity assessment sub-module;
a fitness-for-service for threats other than corrosion sub-module;
a future integrity assessment sub-module;
a remnant lifetime analysis sub-module;
a cathodic protection system sub-module;
a free span assessment sub-module;
a remedial action plan sub-module;
a maximum allowable operation pressure de-rating/repair sub-module;
a permit-to-work sub-module;
a pipeline system integrity assessment sub-module; and
a cleaning pig performance study sub-module.

8. The system according to claim 1, wherein the prevention, mitigation, monitoring and action plan module comprises:
an operations and maintenance (O&M) manual sub-module;
a next in-line inspection due date sub-module;
an inspection plan sub-module; and
an integrity operating window sub-module.

9. The system according to claim 1, wherein the real time transient model based integrity assessment module comprises:
a pump/compressor station optimization sub-module;
a drag reduction agent management sub-module;
a batch cutting/tracking/management sub-module;
a leak detection system sub-module; and
a hydraulic study sub-module.

10. The system according to claim 1, wherein the management review, integrity performance and key performance indicator module comprises:
an OpEx optimization sub-module;
a management of change sub-module;
a key performance indicator sub-module;

a prediction of next in-line inspection results by machine learning sub-module; and an establish re-assessment schedule and method sub-module.

11. The system according to claim 1, wherein the processor is configured to control the display to display the integrated pipeline data using augmented reality.

12. The system according to claim 1, wherein the corrosion growth rate and corrosion initial rate module comprises:

a corrosion growth rate calculation sub-module.

13. A system for providing an interface that allows access to a system used to collect pipeline integrity related data sets, inspection and survey reports to process integrity status and to determine a remaining lifetime of each point of a pipeline on a sophisticated mapping platform, wherein the system is configured to allow a user to utilize databases and a model to access information needed for pipeline integrity analysis, wherein the system is configured to integrate the databases to allow easy access and centralized storage of needed information for pipeline integrity assessment to deploy results in an Augmented Reality platform, wherein the system includes artificial intelligence to compare two or more consecutive In-Line Inspection (ILI) reports to determine internal and external corrosion rate in the pipeline, wherein the system is configured to evaluate pipeline integrity related inspection reports and determine a remaining lifetime of each point of a pipeline for a certain Maximum Allowable Operating Pressure, wherein a user (as per Operating Expenditures of a Pipeline) and performance based pipeline integrity strategy can decrease that Maximum Allowable Operating Pressure, wherein the system is configured to allow the user to see a required budget to repair the pipeline in a way to be fit for service and safe for the public and the environment, wherein the system comprises the below sub-modules:

a PiMS Platform module;

a risk assessment module;

an in-line inspection enterprise module;

a corrosion growth rate and corrosion initial rate module;

an integrity assessment and fitness-for-service module;

a prevention, mitigation, monitoring and action plan module;

a real time transient model based integrity assessment module; and a management review, integrity performance and key performance indicator module, and wherein the system comprises a processor configured to control a display to display the integrated pipeline data.

* * * * *